United States Patent [19]
Ajika et al.

[11] Patent Number: 5,798,289
[45] Date of Patent: Aug. 25, 1998

[54] METHOD OF MANUFACTURING STACKED CAPACITORS IN A DRAM WITH REDUCED ISOLATION REGION BETWEEN ADJACENT CAPACITORS

[75] Inventors: Natsuo Ajika; Hideaki Arima; Atsushi Hachisuka, all of Hyogo-ken, Japan

[73] Assignee: Mitsubishi Denki Kabushiki Kaisha, Tokyo, Japan

[21] Appl. No.: 716,851

[22] Filed: Sep. 10, 1996

Related U.S. Application Data

[62] Division of Ser. No. 457,193, Jun. 1, 1995, Pat. No. 5,597,755, which is a division of Ser. No. 163,647, Dec. 9, 1993, Pat. No. 6,434,439, which is a continuation of Ser. No. 645,980, Jan. 23, 1991, abandoned.

[30] Foreign Application Priority Data

| Jan. 26, 1990 | [JP] | Japan | 2-16960 |
| Apr. 3, 1990 | [JP] | Japan | 2-89869 |
| Sep. 19, 1990 | [JP] | Japan | 2-251306 |

[51] Int. Cl.$^6$ .................................................. H01L 21/8242
[52] U.S. Cl. .................................................. 438/239; 438/396
[58] Field of Search ................................. 437/47, 48, 52, 437/60, 919; 438/210, 239, 253, 329, 396

[56] References Cited

U.S. PATENT DOCUMENTS

| 5,047,817 | 9/1991 | Wakamiya et al. | 357/23.6 |
| 5,101,251 | 3/1992 | Wakamiya et al. | 357/23.6 |
| 5,185,282 | 2/1993 | Lee et al. | 437/47 |
| 5,218,219 | 6/1993 | Ajika et al. | 257/309 |
| 5,235,199 | 8/1993 | Hamamoto | 257/306 |

FOREIGN PATENT DOCUMENTS

| 3922456 | 7/1989 | Germany . |
| 3918924 | 12/1989 | Germany . |
| 4113233 | 10/1991 | Germany . |
| 41 43 476.5-33 | 11/1996 | Germany . |
| 60-2784 | 1/1985 | Japan . |
| 62-128168 | 6/1987 | Japan . |
| 1-257365 | 10/1989 | Japan . |

OTHER PUBLICATIONS

Kawamoto et al., "A 128μm$^2$Bit-Line Shielded Memory Cell Technology for 64 Mb DRAMS", IEEE 1990 Symposium on VLSI Technology, pp. 13–14.

Yamada et al., "Spread Source/Drain (SDD) MOSFET Using Selective Silicon Growth for 64Mbit DRAMS", IEEE IEDM, Dec. 3, 1989, pp. 2.4.1–2.4.4.

Wakamiya et al., "Novel Stacked Capacitor Cell for 64 Mb DRAM", pp. 69–70, May 22, 1989.

Inoue et al., "A New Stacked Capacitor Cell With Thin Box Structured Storage Node", Extended Abstracts of the 21st Conference on Solid State Devices and Materials, Tokyo, Aug. 28, 1989, pp. 141–144.

Ema et al., "3–Dimensional Stacked Capacitor Cell for 16M and 64M DRAMS", IEDM, Dec. 11–14, 1988, pp. 592, 593, 595.

Shin'ichiro Kimura et al., A new Stacked Capacitor DRAM Cell Characterized by a Storage Capacitor on a Bit–line Structure, pp. 596–599, 1988 IEEE.

*Primary Examiner*—John Niebling
*Assistant Examiner*—Joni Y. Chang
*Attorney, Agent, or Firm*—Lowe, Price, LeBlanc & Becker

[57] ABSTRACT

A method of manufacturing a semiconductor memory device having stacked capacitors is disclosed. After forming a capacitor isolating layer on an insulation layer and forming a contact hole in the insulation layer, a first conductive layer is formed on the insulating layer and the capacitor isolating layer and on an inner surface of the contact hole. The first conductive layer is partially etched and removed by using an etch-back technique to be isolated into a first capacitor portion and a second capacitor portion. A dielectric layer is formed on the first conductive layer. A second conductive layer is formed on the dielectric layer.

1 Claim, 28 Drawing Sheets

METHOD OF MANUFACTURING STACKED CAPACITORS IN A DRAM WITH REDUCED ISOLATION REGION BETWEEN ADJACENT CAPACITORS

This application is a division of application Ser. No. 08/457,193, filed Jun. 1, 1995, now U.S. Pat. No. 5,597,755 which is a division of application Ser. No. 08/163,647 filed Dec. 9, 1993, now U.S. Pat. No. 6,434,439 which is a continuation of application Ser. No. 07/645,980 filed Jan. 23, 1991 now abandoned.

BACKGROUND OF THE INVENTION

1. Field of the Invention

The present invention relates generally to an arrangement of dynamic random access memory (DRAM) in which capacitances of capacitors can be increased as the memory is miniaturized and a manufacturing method therefor.

2. Description of the Background Art

In recent years, with the remarkable spread of information apparatuses such as computers, there is an increasing demand for semiconductor memory devices. Furthermore, demanded is a semiconductor memory device having a large memory capacity and capable of operating at a high speed. Accordingly, developments have been made in semiconductor memory device technique to achieve high integration and high speed response or high reliability.

Of the semiconductor memory devices, the DRAM capable of inputting and output stored information at random generally comprises a memory cell array which is a storage region for storing a lot of pieces of storage information and peripheral circuits necessary for inputting/outputting the information from/to the outside. FIG. 11 is a block diagram showing an arrangement of a common DRAM. In the drawing, a DRAM 50 comprises a memory cell array 51 for storing data signals of storage information, a row and column address buffer 52 for externally receiving address signals for selecting memory cells constituting a unit storage circuit, a row decoder 53 and a column decoder 54 for decoding the address signals to designate the memory cells, a sense refreshing amplifier 55 for amplifying the signals stored in the designated memory cells and reading the same, a data-in buffer 56 and a data-out buffer 57 for inputting/outputting data and a clock generator 58 for generating clock signals.

The memory cell array 51 occupying a large area of a semiconductor chip has a plurality of memory cells arranged in matrix for storing unit storage information.

FIG. 12 is a diagram showing an equivalent circuit of 4-bit memory cells forming the memory cell array 51. Each of the shown memory cells is an one-transistor one-capacitor type memory cell comprising one MOS (Metal Oxide Semiconductor) transistor and one capacitor connected thereto. Since a memory cell of this type has a simple arrangement, it is easy to improve the degree of integration of the memory cell array, and therefore it is widely used in a large capacity DRAM.

In addition, memory cells of the DRAM can be classified into several types depending on capacitor arrangements. FIG. 13 is a sectional view showing an arrangement of a memory cell having a typical stacked type capacitor, which is disclosed in, for example, Japanese Patent Publication No. 60-2784. Referring to FIG. 13, the memory cell comprises one transfer gate transistor and one stacked type capacitor (referred to as a stacked type capacitor hereinafter). The transfer gate transistor comprises a pair of source/drain regions 6, 6 formed in a surface of a silicon substrate 1 and a gate electrode (word line) 4 formed on the surface of the silicon substrate with an insulation layer interposed therebetween. The stacked type capacitor comprises an underlying electrode (storage node) 11 extending from a position above the gate electrode 4 to a position above a field isolation film 2 and a part of which is connected to one of the source/drain regions 6, 6, a dielectric layer 12 formed on a surface of the underlying electrode 11 and an upper electrode (cell plate) 13 formed on a surface of the dielectric layer 12. Furthermore, a bit line 15 is formed on the capacitor with an interlayer insulation layer 20 interposed therebetween, the bit line 15 being connected to the other of source/drain regions 6 of the transfer gate transistor through a bit line contact portion 16. The stacked type capacitor is characterized in that capacitance of a capacitor is ensured by providing the main part of the capacitor extending above the gate electrode and the field isolation film to increase an area where the electrodes of the capacitor are opposed to each other.

Generally, capacitance of the capacitor is proportional to the area where the electrodes are opposed to each other and inversely proportional to a thickness of the dielectric layer. Accordingly, it is desirable to increase the area where the electrodes of the capacitor are opposed to each other from the view point of the increase of capacitor capacitance. Meanwhile, as the DRAM has been highly integrated, the size of a memory cell has been drastically reduced. Accordingly, a capacitor region also tends to have a reduced plane area. However, the charge amount which one-bit memory cell can store should not be reduced from the view point of a stable operation and reliability of the DRAM as a memory device. In order to meet such contradictory requirements, various improvements have been made in an arrangement of capacitor which allow a plane area of the capacitor to be reduced and an area where electrodes are opposed to each other to be increased.

FIG. 14 is a sectional view showing an arrangement of a memory cell comprising a so-called cylindrical stacked type capacitor described in "Symposium on VLSI Tech." p65 1989). Referring to FIG. 14, a transfer gate transistor comprises a gate electrode (word line) 4c with a periphery covered with an insulation layer 22. Source and drain regions are not shown in the drawing. A word line 4d with a periphery of which covered with the insulation layer 22 is formed on a surface of a shield electrode 40 which is formed on a surface of a silicon substrate 1 with a shield gate insulation film 41 interposed therebetween. An underlying electrode 11 of the capacitor comprises a base portion 11a formed on a surface of the insulation layer 22 covering surfaces of the gate electrode 4c and the word line 4d, and a cylindrical portion 11b vertically and upwardly extending from a surface of the base portion 11a in the form of a cylinder. A dielectric layer and an upper electrode are sequentially deposited on a surface of the lower electrode 11 (not shown). In the cylindrical stacked type capacitor, not only the base portion 11a but also the cylindrical portion 11b can be used as a region for storing electric charges, especially the cylindrical portion 11b enabling the capacitance of the capacitor to be increased without increasing the plane area of the capacitor. A nitride film 42 is left on a part of the surface of the insulation layer 22.

Now, manufacturing steps of the memory cell shown in FIG. 14 will be described with reference to FIGS. 15A through 15F.

First, referring to FIG. 15A, formed on the surface of the silicon substrate 1 into predetermined configurations are the shield gate insulation film 41, the shield electrode 40, the word lines 4a and 4c, the insulation layer 22 and the nitride film 42.

Now, referring to FIG. 15B, a polycrystalline silicon layer is deposited on the surface of the silicon substrate 1, which is patterned into a predetermined configuration. As a result, a base portion 11a of the lower electrode 11 of the capacitor is formed.

Then referring to FIG. 15C, an insulation layer 43 is formed to be thick over the whole surface. Then, an opening portion 44 reaching the base portion 11a of the lower electrode is formed in the insulation layer 43 by etching. A polycrystalline silicon layer 110b is deposited on an internal surface of the opening surface 44 and on a surface of the insulation layer 43.

Referring to FIG. 15D, the polycrystalline silicon layer 110b is selectively etched by the anisotropic etching. As a result, the cylindrical portion 11b is formed which extends vertically and upwardly from the surface of the base portion 11a of the lower electrode 11 of the capacitor, completing the lower electrode 11.

Then, as shown in FIG. 15E, a dielectric layer 12 and an upper electrode 13 are sequentially formed on the surface of the lower electrode 11.

Then, as shown in FIG. 15F, after entirely covering a portion on the silicon substrate 1 with an interlayer insulation layer 20, a contact hole is formed at a predetermined position in which a bit line contact portion 16 is formed. Thereafter, a bit line to be connected to the bit line conductor portion 16 is formed on a surface of the interlayer insulation layer 20 (not shown).

However, as capacity of DRAM is further increased, a plane area of the base portion 11a of the lower electrode 11 is further reduced inevitably in the above-described cylindrical stacked type capacitor. The base portion 11a is largely occupied by a plane surface region reducing in proportion to the reduction of the plane area of the capacitor. In addition, in the cylindrical portion 11b, both of inner and outer surfaces of the cylindrical portion 11b are used as capacitance portions, which occupying an increased area in the entire capacitance regions of the capacitor. Accordingly, it becomes important to make the best use of the cylindrical portion in the reduced plane area of the capacitor.

In addition, the base portion 11a and the cylindrical portion 11b of the lower electrode 11 of the conventional cylindrical stacked type capacitor are formed in different manufacturing steps. Therefore, a plurality of film manufacturing steps and mask patterning steps are required, which makes the manufacturing steps complicated. Furthermore, reliability in insulation of the dielectric layer formed on the surface of the lower electrode 11 is deteriorated in the connection portion between the base portion 11a and the cylindrical portion 11b of the lower electrode 11.

Furthermore, the conventional semiconductor memory device requires a plurality of photolithography steps for manufacturing a cylindrical stacked type capacitor, thereby requiring highly precise registration of a mask. Accordingly, the manufacturing step is made complicated and increases in number.

Description will be made of a conventional DRAM having different stacked type capacitors. A lower electrode of this stacked type capacitor includes a box-shaped standing wall portion.

FIG. 16 is a sectional view showing the arrangement of the memory cell of this DRAM. Referring to FIG. 16, a Si substrate 201 is divided into the respective memory cells by a field oxide film 202.

A MOS transistor for a memory cell comprises a source region 203, a drain region 204 and a gate electrode 205 formed on the surface of the Si substrate 201. Polysilicon, metal, metal silicide and the like are used as a material of the gate electrode 205.

A capacitor cell for use in a memory cell comprises a polysilicon layer 210, a capacitor insulating film 211 having a double or a triple structure including a $SiO_2$ film and a $Si_2N_2$ film and a $SiO_2$ film, and a polysilicon layer 212 forming a cell plate, all of which films are formed in a CVD·$SiO_2$ film 213 forming an interlayer insulating film.

Polysilicon layer 210 constituting a storage node has a wall portion standing upwardly at its side and the polysilicon layer 212 forming a cell plate opposite to the inner and the outer surfaces of the wall portion, which increases the surface area of the capacitor, so that a larger capacitance of a capacitor can be obtained in the same area as that of the conventional stacked capacitor cell. In addition, since the capacitor area is larger than that of the stacked capacitor cell of the Embodiment 1, the stacked capacitor cell of the present Embodiment allows a capacitance of the capacitor to become larger than that of the stacked capacitor cell of the Embodiment 1.

Now, a manufacturing method of this stacked capacitor cell will be described.

FIGS. 17A to 17D are diagrams showing the respective manufacturing steps for forming the memory cell shown in FIG. 16.

Referring to FIGS. 17A to 17D and FIG. 16, the manufacturing method of this stacked capacitor cell will be described.

Referring to FIG. 17A, field oxide film 202 which is an element isolation region is formed in the surface of the Si substrate 201 by a LOCOS method and the source region 203 and the drain region 204 are formed through diffusion or ion implantation.

Then, after forming a gate oxide film, polysilicon, high melting point metal, high melting point metal silicide or high melting point metal polycide is deposited on the gate oxide film, which is patterned to form the gate electrode 205.

Then, after depositing the $SiO_2$ film over the surface by the CVD method, the peripheries of the gate electrode 205 and the other wirings are covered with a CVD·$SiO_2$ film 206 forming an interlayer insulating film by anisotropic etching.

Referring to Fog. 17B a thin $Si_3N_4$ film 207 is deposited over the surface.

Then, after applying a spin on grass (SOG) 208 flat on the entire surface of the Si substrate 201, a resist 209 is applied to the entire surface and then the resist is removed to leave a portion wherein a storage node is formed.

The height of the wall portion of the storage node is determined by a thickness of the SOG 208.

Referring to FIG. 17C, the SOG 208 at the portion wherein a storage node is formed is removed by etching, using the resist 208 (FIG. 10) as a mask.

Then, after exposing the surface of the Si substrate 201 above the drain region 204 to make a contact between the storage node and the drain region 204, the polysilicon layer 210 which is to be a storage node is deposited by a vapor deposition method.

Thereafter, the SOG 208 is removed by etching.

Referring to FIG. 17D, the capacitor insulating film 211 is formed on the surface of the polysilicon layer 210 at the stage where the outer and the inner surfaces of the wall portion standing on the bottom surface of the polysilicon layer 210 for a storage node are exposed. The capacitor insulating film 211 is formed on the bottom surface, and the outer and inner surfaces of the wall portion of the polysilicon layer 210 for a storage node. A double layer or a triple layer including a thermal $SiO_2$ film, or a $Si_3N_4$ film and a $SiO_3$ film is used as the capacitor insulating film 211.

Referring to FIG. 16, after the formation of the capacitor insulating film 211, polysilicon layer 212 for a cell plate is deposited and a patterning for the cell plate is carried out.

Then, after depositing the CVD·$SiO_2$ film 213 forming an interlayer insulating film by the CVD method, a contact is made between the source region 203 and an Al wiring 214.

The stacked capacitor cell according to the present embodiment is completed through the above described steps.

Such a stacked type capacitor allows its capacitors to be increased with the standing wall portion of the storage node 210 provided therein. The Al wiring 214 forming a bit line however contacts the source region 203 on the substrate surface from the upper portion of the capacitor. Therefore, it is necessary to isolate a part of the capacitor located above the gate electrode 205 from the Al wiring 214 by the $SiO_2$ film 213 having a film thickness needed to maintain the insulation. As a result, a region wherein a capacitor is formed is limited.

SUMMARY OF THE INVENTION

An object of the present invention is to increase capacitance of a capacitor of a DRAM.

Another object of the present invention is to increase capacitance of a cylindrical portion of a so-called cylindrical stacked type capacitor.

A further object of the present invention is to reduce an isolation region between adjacent capacitors.

Still another object of the present invention is to provide a method of manufacturing a cylindrical stacked type capacitor comprising increased capacitance of a capacitor.

A still further object of the present invention is to provide a method of integrally forming a lower electrode of a stacked type capacitor.

According to a first aspect of the present invention, the DRAM comprises a semiconductor substrate of a second conductivity type having a main surface and an impurity region of a first conductivity type in the main surface, and an insulation layer formed on the main surface of the semiconductor substrate and having an opening reaching the impurity region. The DRAM further comprises a first electrode layer having a first portion formed on and in contact with a surface of the impurity region and a surface of the insulation layer and a second portion extending along an outermost periphery of the first portion and vertically and upwardly from the main surface of the semiconductor substrate. A dielectric layer is formed on a surface of the first electrode layer and a second electrode layer is formed on a surface of the dielectric layer.

A film thickness of the second portion of the first electrode of the capacitor is formed to be smaller than the film thickness of the first portion.

The second portion of the lower electrode of the capacitor is formed extending vertically and upwardly from the outermost peripheral portion of the first portion formed relatively flat. With the second portion formed along the outermost periphery of the first portion, the effective capacitance region of the second portion is greatly increased as compared with a rate of increase of the plane area surrounded by the second portion. As a result, it becomes possible to ensure or increase the capacitance of the capacitor even if the plane area of the capacitor is reduced.

According to a second aspect of the present invention, the DRAM comprises a memory cell array having a plurality of memory cells arranged for storing unit storage information. The DRAM further comprises a semiconductor substrate having a main surface, a plurality of word lines extending in parallel with each other on the main surface of the semiconductor substrate, a plurality of bit lines extending in a direction intersecting with the plurality of word lines on the main surface of the semiconductor substrate and memory cells arranged near crossing portions between the bit lines and the word lines. Each of the memory cells comprises a transfer gate transistor and a capacitor. The transfer gate transistor comprises a pair of impurity regions formed between adjacent bit lines on the main surface of the semiconductor substrate in a direction along the bit lines, and a gate electrode comprising a part of the word lines formed between the pair of impurity regions on the main surface of the semiconductor substrate with a gate insulation layer provided therebetween. The capacitor comprises a first electrode layer having a first portion formed on and in contact with a surface of one of the paired impurity regions of the transfer gate transistor and on and in contact with a surface of an interlayer insulation layer covering a surface of the transfer gate transistor and a second portion extending along an outermost periphery of the first portion and vertically and upwardly extending from the main surface of the semiconductor substrate, a dielectric layer covering a surface of the first electrode and a second electrode covering a surface of the dielectric layer. The bit line is formed closer to the main surface of the semiconductor substrate than to the second portion of the first electrode layer of the capacitor. With the bit line disposed below the lower electrode of the capacitor, arrangement of a bit line contact between capacitors of the adjacent memory cells is prevented. As a result, it is possible to miniaturize an isolation region between the adjacent capacitors, reducing an element arrangement or increasing a plane area of the capacitor.

According to another aspect of the present invention, a second portion of a lower electrode of a capacitor is formed extending obliquely and upwardly from an outermost periphery of a first portion.

According to a still another aspect of the present invention, the DRAM comprises first and second stacked type capacitors formed isolated from each other partially covering a surface of an insulation layer covering a main surface of a semiconductor substrate, a manufacturing method of which includes the following steps.

First, the insulation layer is formed on the main surface of the semiconductor substrate and then, a capacitor isolating layer having approximately vertical side surfaces is formed on the isolation region between the first and second capacitors on a surface of the insulation layer. Then, a contact hole reaching the main surface of the semiconductor substrate is formed at a predetermined position of the insulation layer, and a first conductive layer is formed on an inner surface of the contact hole, the surface of the insulation layer and a surface of the capacitor isolating layer. Then, a layer to be etched back having a different etching ratio from that of the first conductive layer is formed on a surface of the first conductive layer and the surface of the first conductive layer located on an upper surface of the capacitor isolating layer is exposed by etching the layer to be etched back.

Furthermore, the first conductive layer exposed from the etched back layer is partially removed by etching to isolate the first conductive layer into a first capacitor portion and a second capacitor portion. Thereafter, the capacitor isolating layer and the etched back layer are removed to form a dielectric layer and a second electrode layer on the surface of the first conductive layer.

The lower electrode of the capacitor can be integrally formed by forming the capacitor isolating layer in a region corresponding to the isolation region between the adjacent capacitors and using sidewalls of the capacitor isolating layer and the like.

According to a still further aspect of the present invention, the DRAM comprises first and second stacked type capacitors formed isolated from each other partially covering a surface of an insulation layer covering a main surface of a semiconductor substrate, and a manufacturing method thereof includes the following steps.

After forming the insulation layer on the main surface of the semiconductor substrate, an etching stopping layer is formed on the surface of the insulation layer. Then, a capacitor isolating layer having vertical side surfaces is formed on an isolation region between the first and second capacitors on a surface of the etching stopping layer. Then, a contact hole reaching the main surface of the semiconductor substrate is formed at a predetermined position of the insulation layer and the etching stopping layer and a first conductive layer is formed on an inner surface of the contact hole, the surface of the etching stopping layer and the surface of the capacitor isolating layer. Furthermore, a layer to be etched back having a different etching ratio from that of the first conductive layer is formed on a surface of the first conductive layer and the surface of the first conductive layer located on an upper surface of the capacitor isolating layer is exposed by etching the layer to be etched back. Furthermore, the first conductive layer is isolated into a first capacitor portion and a second capacitor portion by partially etching and removing the first conductive layer exposed from the etched back layer. Thereafter, the capacitor isolating layer and the etched back layer are removed. Then, a dielectric layer is formed on the surface of the first conductive layer.

Accuracy in detecting an end point of etch back for use in the formation of the capacitor isolating layer is improved by forming a etching stopping layer between the insulation layer and the capacitor isolating layer.

According to a further aspect of the present invention, the DRAM comprises first and second stacked type capacitors formed isolated from each other partially covering surface of an insulation layer covering a main surface of a semiconductor substrate, and a manufacturing method of which includes the following steps.

A first insulation layer having an opening reaching the main surface of the semiconductor substrate is formed at a predetermined position of the main surface of the semiconductor substrate. A first conductive layer is formed on a surface of the first insulation layer and inside the opening. Furthermore, a second insulation layer having a predetermined film thickness is formed on a surface of the first conductive layer. Then, a capacitor isolating layer comprising the second insulation layer having approximately vertical sidewall surfaces is formed only in an isolation region between the first and second capacitors by patterning the second insulation layer.

Furthermore, a second conductive layer is formed on the surface of the first conductive layer and an upper surface and side surfaces of the capacitor isolating layer.

Thereafter, the second conductive layer formed on the upper surface of the capacitor isolating layer is selectively removed. Then, after the removal of the capacitor isolating layer, a dielectric layer is formed on a surface of the second conductive layer. Then, a third conductive layer is formed on s surface of the dielectric layer.

A patterned capacitor isolating layer is formed at a predetermined position on the surface of the first conductive layer and then a second portion of a first electrode layer of the capacitor is formed in registration by using the surface of the capacitor isolating layer. Furthermore, after the removal of the capacitor isolating layer, only a region of the first conductive layer covered with the capacitor isolating layer is selectively removed, so that first electrode layers of the adjacent capacitors are formed isolated from each other. Accordingly, the first electrode layer is formed in a self-alignment manner by one lithography step, which saves the steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be described in detail with reference to the drawings hereinafter.

Figure 1:
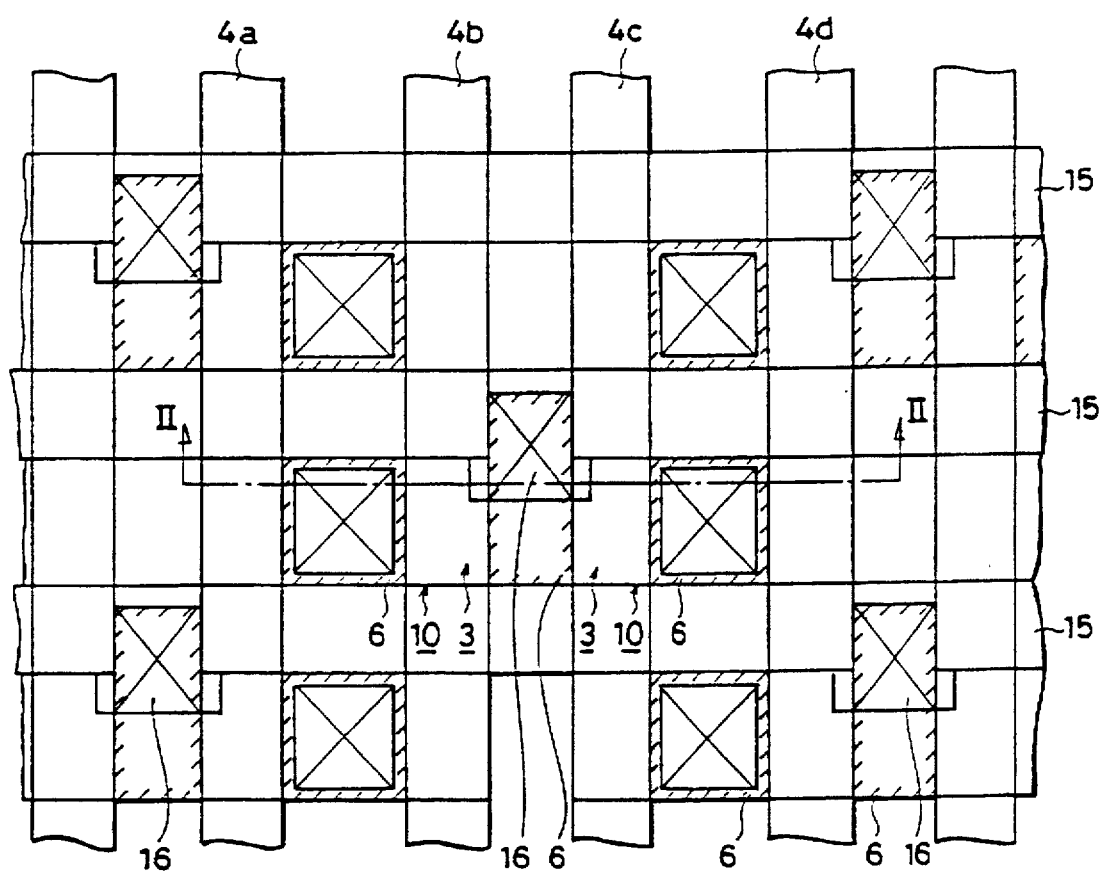
FIG. 1 is a view of a plane arrangement of a memory cell array of a DRAM according to a first embodiment of the present invention.
Figure 2A:
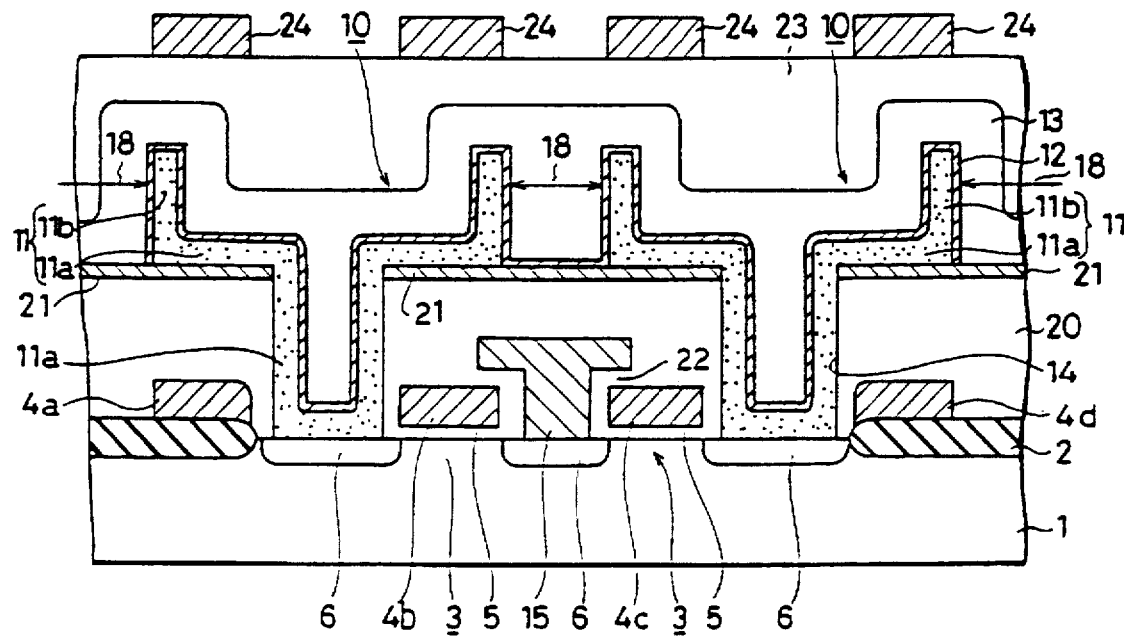
FIG. 2A is a sectional view of an arrangement of memory cells taken along a line II—II in FIG. 1.

Referring mainly to FIG. 1, formed on a surface of a silicon substrate 1 are a plurality of word lines 4a, 4b, 4c and 4d extending in parallel in a row direction, a plurality of bit lines 15 extending in parallel in a column direction and a plurality of memory cells MC arranged near crossing portions between the word lines and the bit lines. Referring to FIGS. 1 and 2A, a memory cell is comprised of one transfer gate transistor 3 and one capacitor 10. The transfer gate transistor 3 comprises a pair of source and drain regions 6, 6 formed on the surface of the silicon substrate 1 and gate electrodes (word lines) 4b and 4c formed between the source and drain regions 6 and 6 on the surface of the silicon substrate 1 with a gate insulation film 5 interposed therebetween. Each periphery of the gate electrodes 4b and 4c is covered with an insulation layer 22. Furthermore, a thick interlayer insulation layer 20 is formed on a region of the transfer gate transistor 3 in the surface of the silicon substrate 1. A contact hole 14 reaching one of the source and drain regions 6 of the transfer gate transistor 3 is formed in a predetermined region of the interlayer insulation layer 20.

The capacitor 10 has a multi-layered structure comprising a lower electrode (storage node) 11, a dielectric layer 12 and an upper electrode (cell plate) 13. The lower electrode 11 is comprised of a base portion (a first portion) 11a formed in contact with and on a surface of a nitride film 21 formed on an inner surface of the contact hole 14 and on a surface of the interlayer insulation layer 20, and a standing wall portion (a second portion) 11b formed extending vertically and upwardly along an outermost periphery of the base portion 11a. The base portion 11a and the standing wall portion 11b are integrally formed by a polycrystalline silicon layer with impurities injected therein. The dielectric layer 12 is formed on a surface of the lower electrode 11. Particularly, the dielectric layer 12 is formed so as to cover both an inner side surface and an outer side surface of the standing wall portion 11b of the lower electrode 11. Accordingly, both the inner and outer side surfaces of the standing wall portion 11b of the lower electrode 11 constitute capacitance portions. An oxide film, a nitride film or a composite film of an oxide film and a nitride film or a metal oxide film can be used as the dielectric layer 12. The upper electrode 13 is formed on a surface of the dielectric layer 12. The upper electrode 13 is formed so as to cover almost the whole surface of the memory cell array. Polycrystalline silicon with the impurities injected therein or a metal layer such as high melting point metal are used as the upper electrode 13. A surface of the upper electrode 13 is covered with an insulation layer 23. Then, interconnection layers 24 of a predetermined configuration are formed on a surface of the insulation layer 23.

Figure 2B:
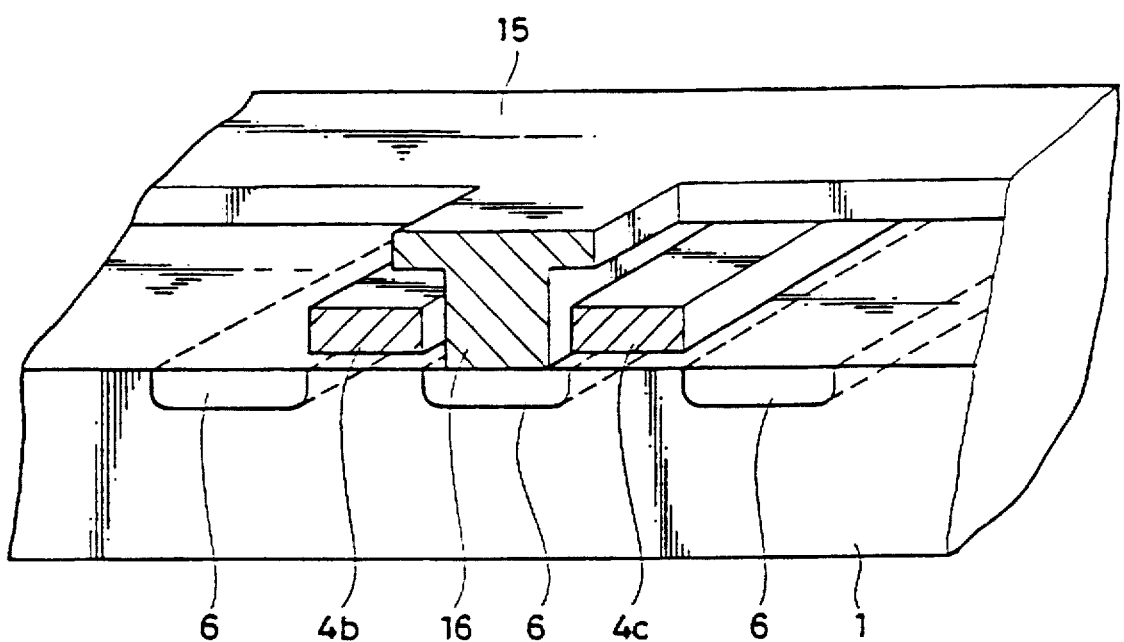
FIG. 2B is a sectional view of an arrangement of the bit line contact taken along a line II—II in FIG. 1.

Referring to FIGS. 2A and 2B, a bit line 15 is connected to one of the source and drain regions 6 of the transfer gate transistor 3. The bit line 15 is formed below the main parts of the standing wall portion 11b and the base portion 11a of the lower electrode 11 of the capacitor 10. Further referring to FIG. 1, the bit line 15 is formed to be partly larger in line width at a bit line contact portion 16. The miniaturized memory cell arrangement requires a width of a bit line to be reduced. However, a bit line contact portion is desirably formed to be large in order to prevent increase of a contact resistance. Thus, the bit line 15 is formed to have a projection portion at the contact portion. In addition, one of the source and drain regions 6 of the transfer gate transistor 3 extends to a region under the bit line 15 in order to contact the bit line 15. Then, the extended source/drain region 6 and the contact portion 16 having increased line width of the bit line 15 form contact between the bit line. As the foregoing, since the contact is formed by extending the contact portions of the source and drain regions 6 and the bit line 15, the bit line 15 and the pair of impurity regions 6 and 6 of the transfer gate transistor can be formed in parallel with each other.

Referring to FIG. 2A, an isolation region 18 between the adjacent capacitors 10 and 10 can be structured to be as narrow as possible. In other words, a plane region of the base portion 11a of the lower electrode 11 of the capacitor 10 can be increased. Accordingly, the increased plane area of the base portion 11a of the lower electrode and the increased peripheral length of the standing wall portion 11b located at the outermost periphery thereof make the entire capacitance of the capacitors 11 to be increased. While a plane configuration of the capacitor 10 as shown in FIG. 1 is rectangular, it is just a schematic representation and therefore it is actually formed into an oval made from a rectangle with four rounded corners or a cylinder.

Now, manufacturing steps of the memory cells the sectional arrangement of which shown in FIG. 2A will be described with reference to FIGS. 3A through 3M.

Figure 3A:
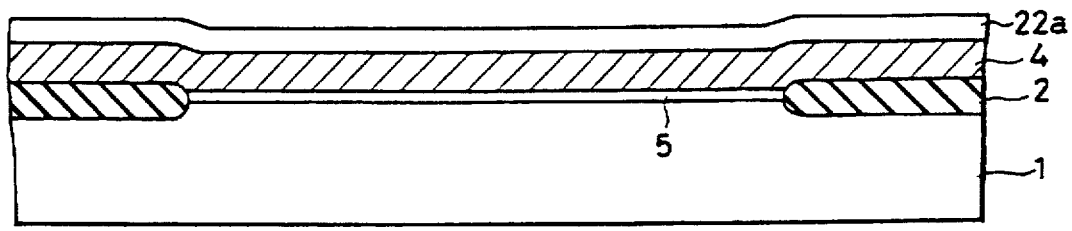
FIGS. 3A, 3B, 3C, 3D, 3E, 3F, 3G, 3H, 3I, 3J, 3K, 3L and 3M are sectional views showing manufacturing steps of the memory cells of the DRAM shown in FIG. 2A.

First, as shown in FIG. 3A, a field oxide film 2 and a channel stopper region (not shown) are formed in predetermined regions on the main surface of the silicon substrate 1. Furthermore, thermal oxide film 5, a polycrystalline silicon layer 4 of a thickness of 1000–2000 Å, preferably 1500 Å and an oxide film 22a of a thickness of 1000–2000 Å, preferably 1500 Å by the CVD method are sequentially formed on the surface of the silicon substrate 1.

Figure 3B:
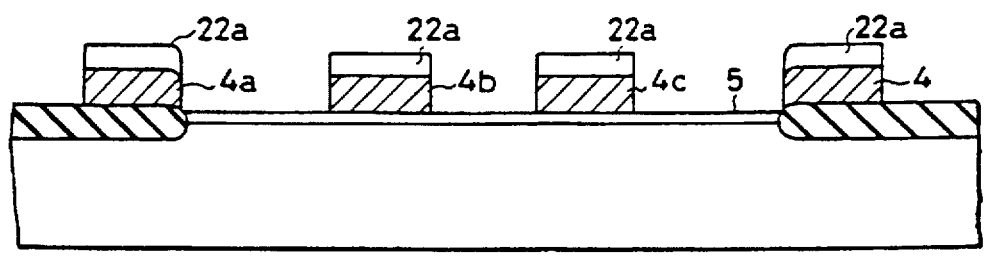

Now, as shown in FIG. 3B, the word line 4a, 4b, 4c and 4d are formed by photolithography and etching method. The patterned oxide film 22a is left on the surfaces of the word lines 4a–4d.

Figure 3C:
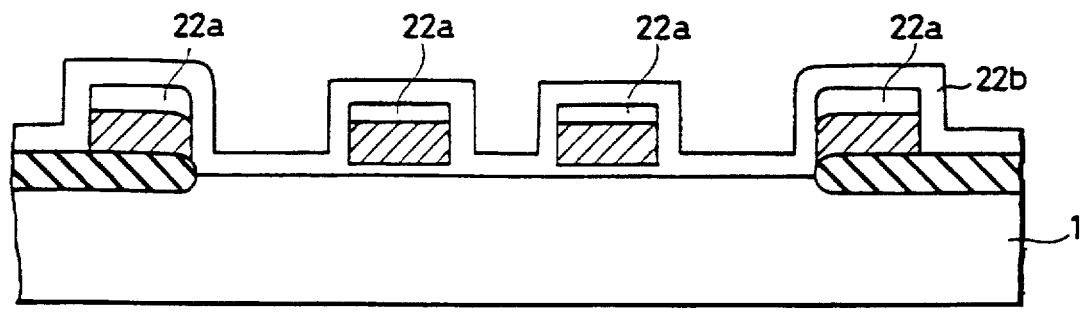

Then, as shown in FIG. 3C, an oxide film 22b of a thickness of 1000–2000Å, preferably 1500 Å is deposited on the whole surface of the silicon substrate 1 by the CVD method.

Figure 3D:
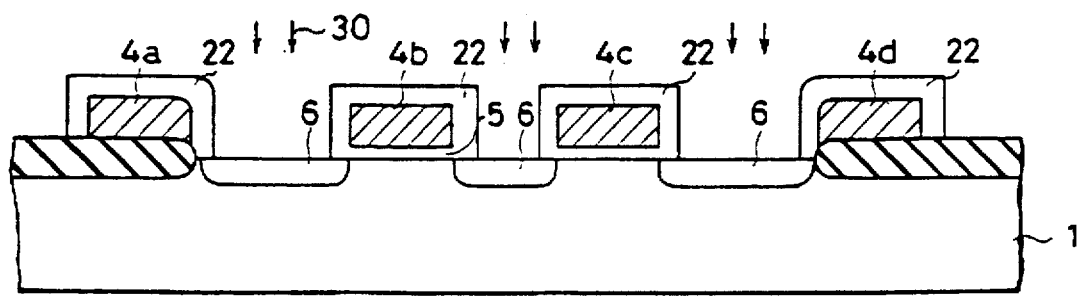

Then, as shown in FIG. 3D, an insulation layer 22 of an oxide film is formed on the peripheries of the word lines 4a–4d by anisotropically etching the oxide film 22b. Then, impurity ions 30, arsenic are implanted under an implantation energy of 30 KeV, a dose of $4 \times 10^{15}/cm^2$ in the surface of the silicon substrate 1 by using the word lines 4a–4d covered with the insulation layer 22 as masks to form the source and drain regions 6 and 6 of the transfer gate transistor.

Figure 3E:
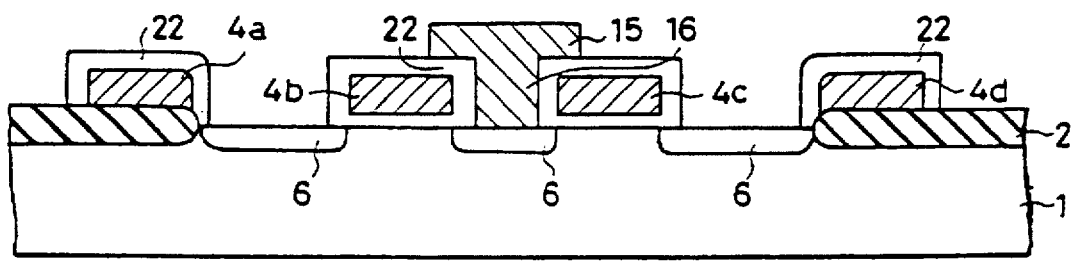

Then, as shown in FIG. 3E, a conductive layer such as a doped polysilicon layer or a metal layer, and a metal silicide layer and the like are formed on the surface of the silicon substrate 1, which are patterned into the predetermined configuration. As a result, the bit line 15 and the bit line contact 16 are formed.

Figure 3F:
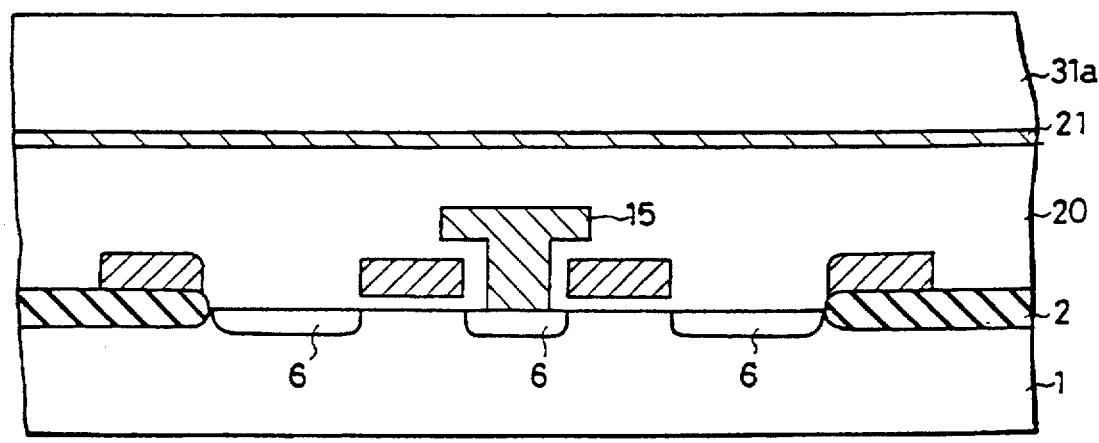

Now as shown in FIG. 3F, the interlayer insulation film 20 is formed on the surface of the silicon substrate 1. Then, a nitride film 21 having a film thickness of, for example, more than 100 Å is formed on the interlayer insulation film 20 by the CVD method. Then, an oxide film 31a having a film thickness, for example, of more than 5000 Å is formed on a surface of the nitride film 21 by the CVD method. The film thickness of the oxide film 31a will define a height of the standing wall portion 11b of the lower electrode 11 of the capacitor 10 in a later step. Accordingly, the film thickness varies depending on a set value of capacitance of the capacitor of the DRAM as a product. In addition, a combination of the nitride film 21 and the oxide film 31a is selected such that a etching ratio of the former to the etching is different from that of the latter to the etching.

Figure 3G:
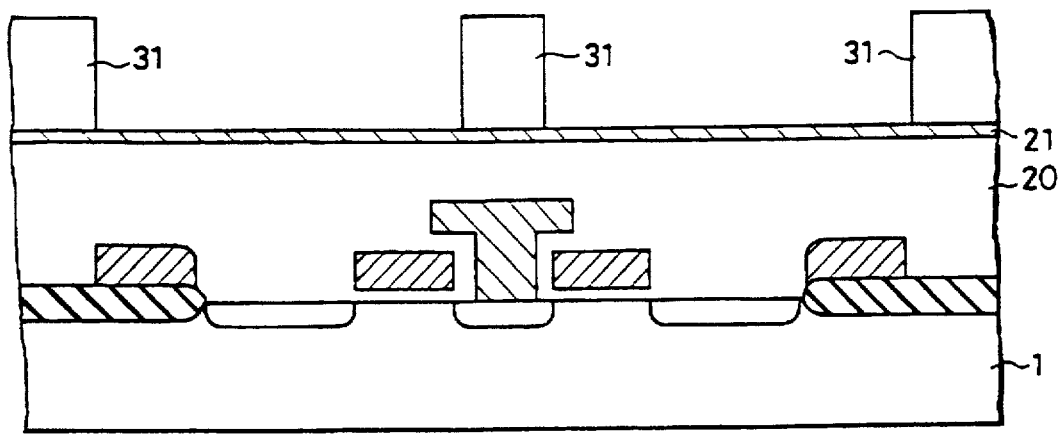

Furthermore, as shown in FIG. 3G, a capacitor isolating layer 31 for isolating the adjacent capacitors is formed by patterning the oxide film 31a by the etching method. The selective ratio of the etching of the nitride film 21 to the oxide film 31a is 10 to 15. Therefore, in this etching step, the nitride film 21 is etched at a different speed from that of the oxide film 31a. Accordingly, when the etching reaches the surface of the nitride film 21, the etching speed is reduced. Taking this occasion, etching the oxide film 31a is finished. In addition, in this etching, the region left as the capacitor isolation layer 31 is finer than the region to be etched away from the oxide film 31a. In the etching technique, a width of the removed region obtained by partially removing the etched layer can be made smaller than a width of the region left after the removal of the unnecessary portion of the etched layer. Therefore, it is possible to make a width of the capacitor isolating layer 31 smaller, resulting in fining isolation between the capacitors.

Figure 3H:
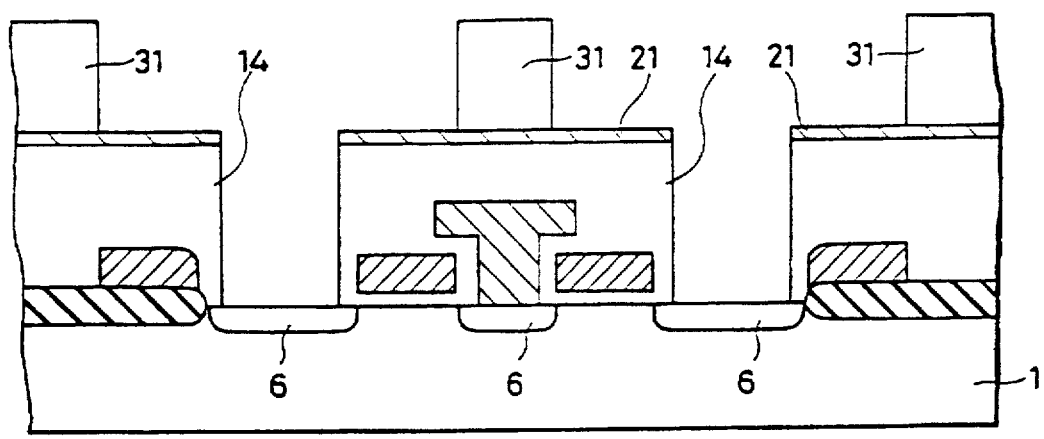

Furthermore, as shown in FIG. 3H, contact holes 14 and 14 are formed so as to reach the source and drain regions 6 and 6 by photolithography and the etching method.

Figure 3I:
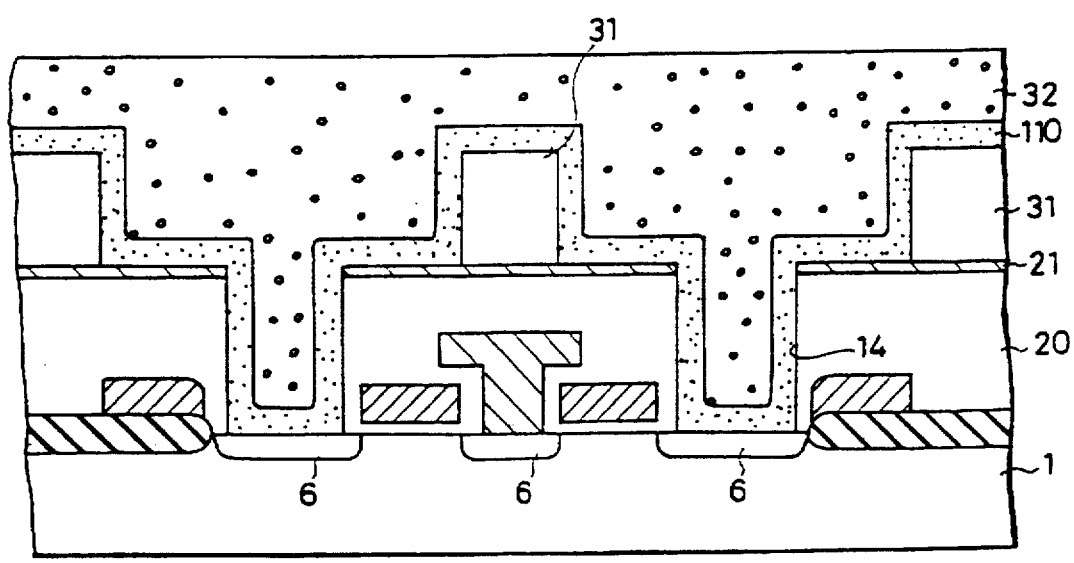

Then, as shown in FIG. 3I, a polycrystalline silicon layer 110 of a thickness of 500–1500 Å, preferably 1000 Å is deposited on an inner surface of the contact hole 14, on the surface of the nitride film 21 and on the surface of the capacitor isolating layer 31 by the CVD method. Then, a thick resist (etched back layer) 32 is applied over a surface of the polycrystalline silicon layer 110.

Figure 3J:
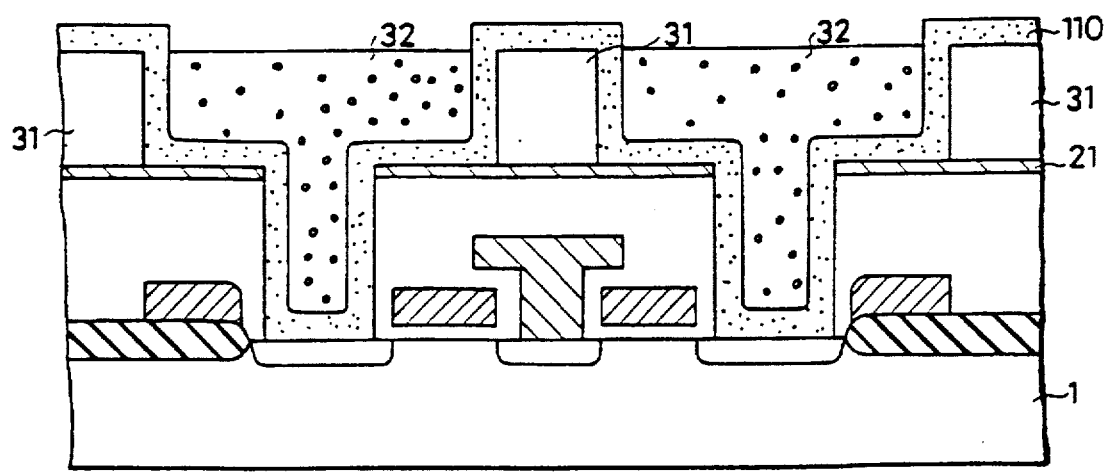

Then, as shown in FIG. 3J, the resist 32 is etched back to expose a part of the polycrystalline layer 110.

Figure 3K:
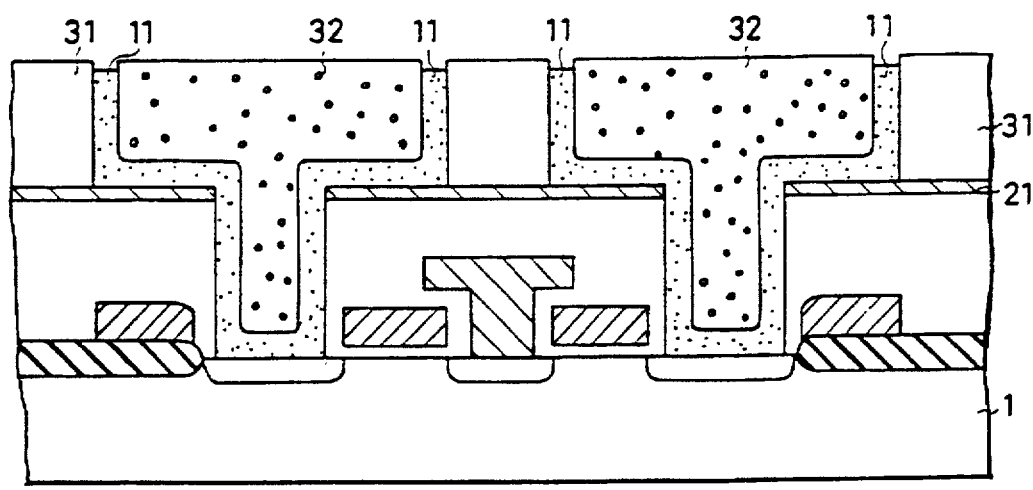

Then, as shown in FIG. 3K, the exposed surface of the polycrystalline silicon layer 110 is selectively removed by anisotropic etch or the like. As a result, the polycrystalline silicon layer 110 is isolated on the surface of the capacitor isolating layer 31 to form the lower electrode 11 of each capacitor.

Figure 3L:
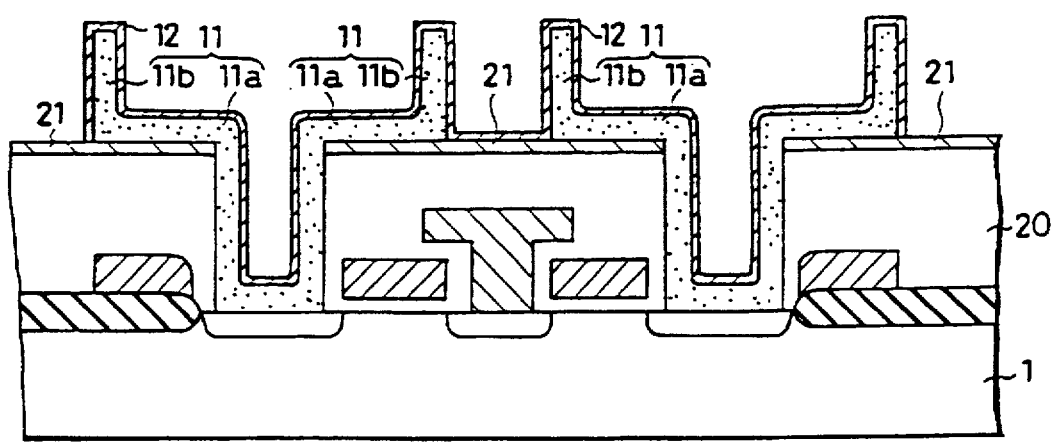

Then, as shown in FIG. 3L, the resist 32 is removed by etching and furthermore the capacitor isolating layer 31 is removed by using fluorine or the like. Then, the dielectric layer 12 such as a nitride film is formed on the surface of the lower electrode 11.

Figure 3M:
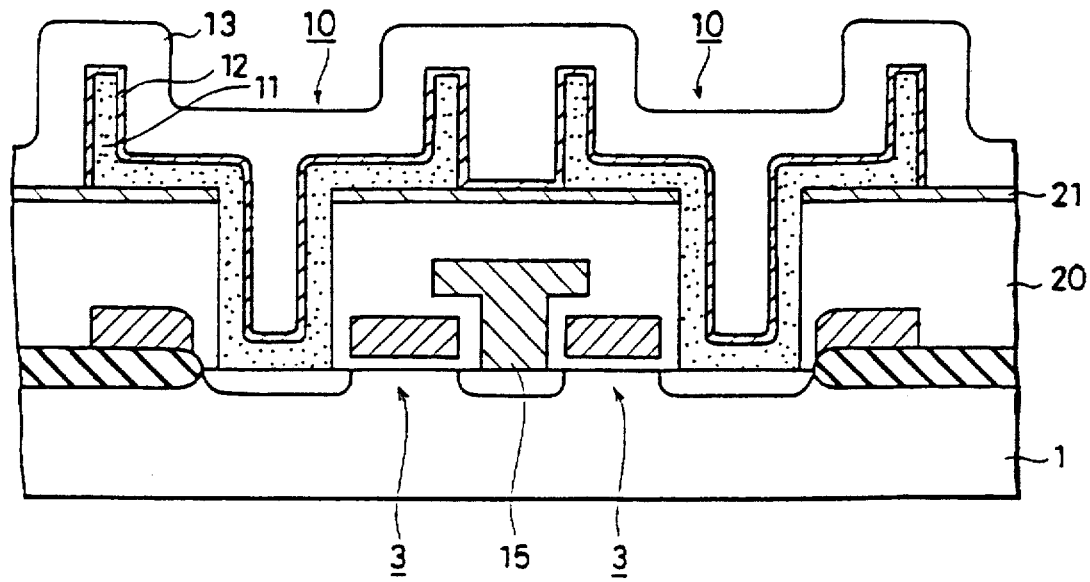

Then, as shown in FIG. 3M, the upper electrode 13 a thickness of 2000–3000 Å of a polycrystalline silicon layer or the like is formed on the surface of the dielectric layer 12 by the CVD method. Thereafter, the insulation layer 23 and the interconnection layer 24 or the like are formed to complete the manufacturing steps of the memory cell of the DRAM.

Figure 4:
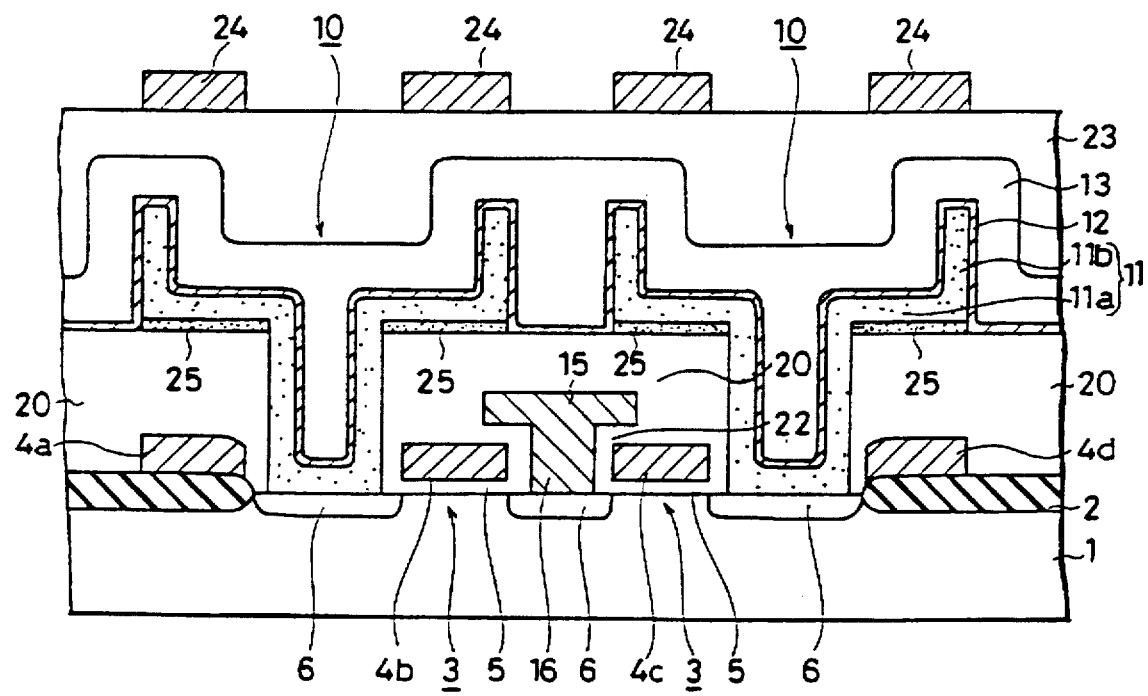
FIG. 4 is a sectional view of an arrangement of memory cells of a DRAM according to a second embodiment of the present invention.

Now, a memory cell of a DRAM according to a second embodiment of the present invention will be described. FIG. 4 is a sectional view of an arrangement of a capacitor corresponding to that according to the first embodiment shown in FIG. 2A. Referring to FIG. 4, the second embodiment is characterized by using a polycrystalline silicon layer 25 as an etching stopping layer formed on the surface of the interlayer insulation layer 20. While the polycrystalline silicon layer 25 is used for preventing over-etching in a manufacturing step which will be described later, after the completion it constitutes the lower electrode 11 of the capacitor integrally with the lower electrode 11.

Figure 5A:
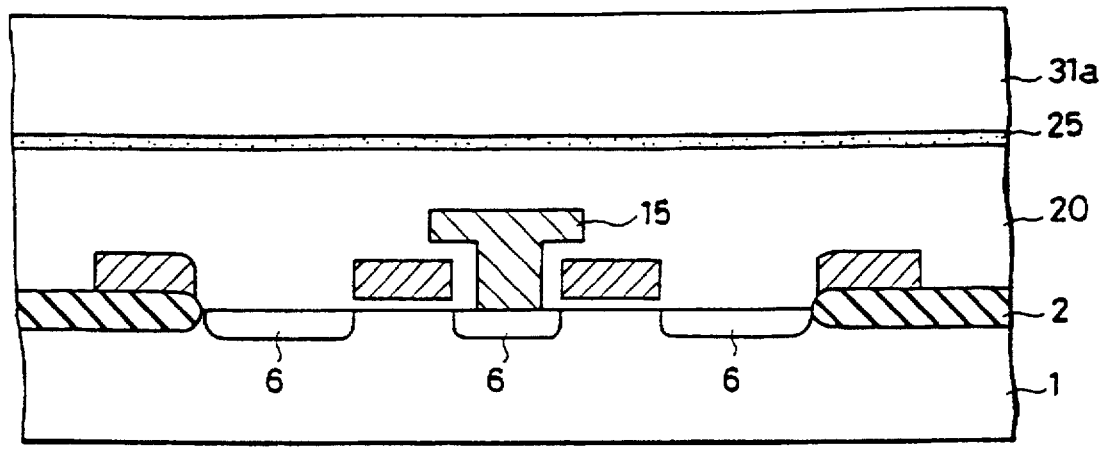
FIGS. 5A, 5B, 5C, 5D, 5E, 5F, 5G and 5H are sectional views showing main manufacturing steps of the memory cells shown in FIG. 4.

Now, manufacturing steps of the memory cell of the DRAM shown in FIG. 4 will be described. Since the manufacturing steps of the memory cell according to the second embodiment largely overlap with the manufacturing steps of the memory cell of the DRAM according to the first embodiment shown in FIGS. 3A through 3M, description will be made only of the distinctive manufacturing steps and no description will be made of the other manufacturing steps for which the first embodiment is referred to. First, as shown in FIG. 5A (corresponding to FIG. 3F), the polycrystalline silicon layer 25 is deposited on the surface of the interlayer insulation layer 20 by the CVD method. Then, the oxide film 31a is formed on the surface thereof. The polycrystalline silicon layer 25 has an etching selectivity higher than that of the oxide film 31a formed thereon.

Figure 5B:
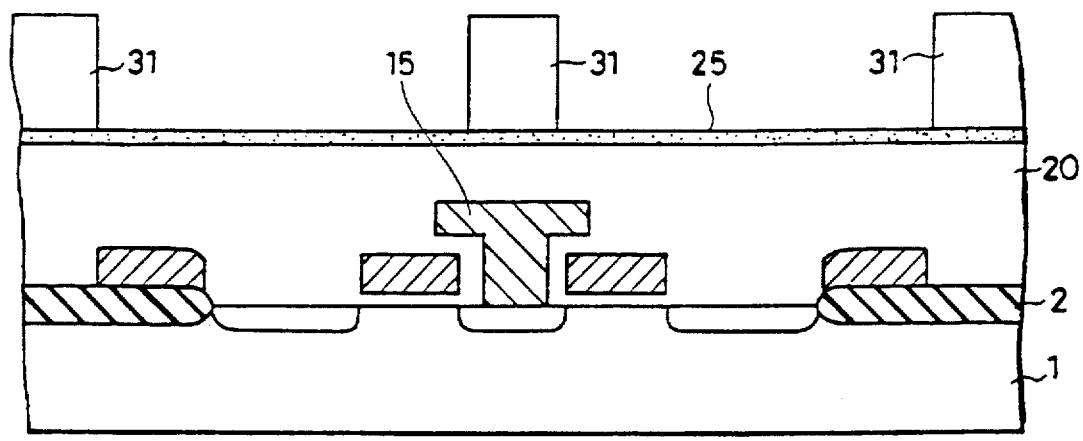

Now, as shown in FIG. 5B (corresponding to FIG. 3G), the oxide film 31a is selectively etched to form the capacitor isolating layer 31. On this occasion, the polycrystalline layer 25 is used for detecting the etching end point of the oxide film 31a by controlling the etching time to prevent over-etching of the underlying interlayer insulation layer 20.

Figure 5C:
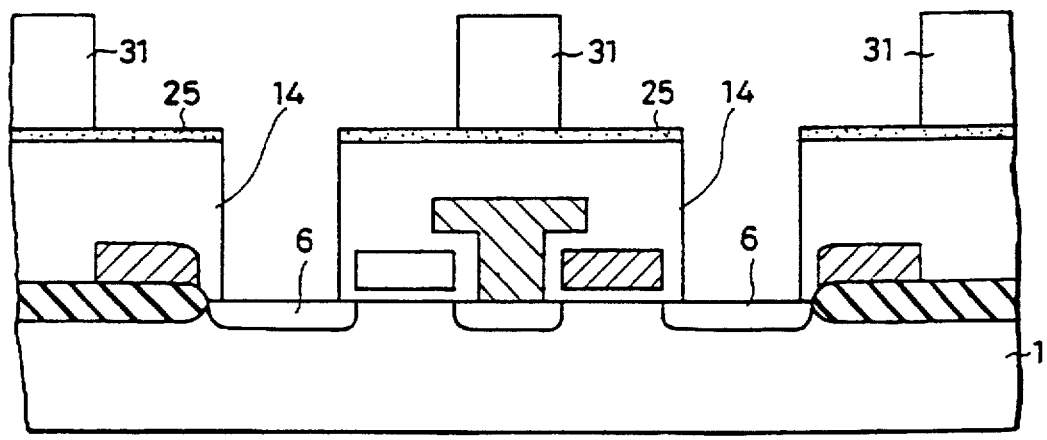

Then, as shown in FIG. 5C (corresponding to FIG. 3H), the contact hole 14 reaching the source and drain regions 6 and 6 is formed in the polycrystalline silicon layer 25 and the interlayer insulation layer 20 by the photolithography method and the etching method.

Figure 5D:
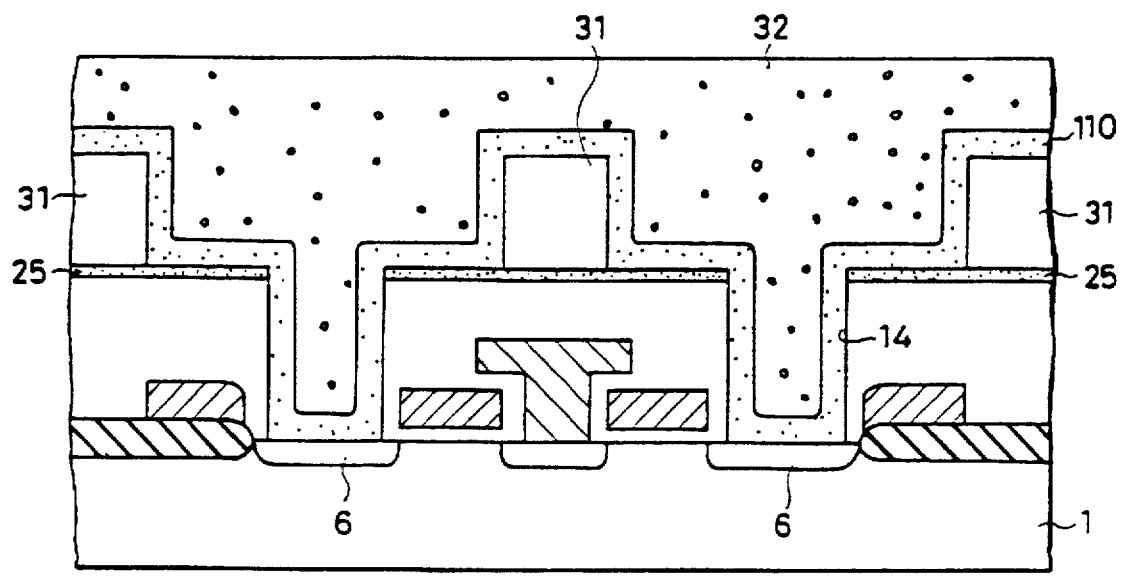

Then, as shown in FIG. 5D (corresponding to FIG. 3I), the polycrystalline silicon layer 110 is deposited on an inner surface of the contact hole 14 and on the surfaces of the polycrystalline silicon layer 25 and the capacitor insulating layer 31. Then, the thick resist 32 is applied over the surface of the polycrystalline silicon layer 110.

Figure 5E:
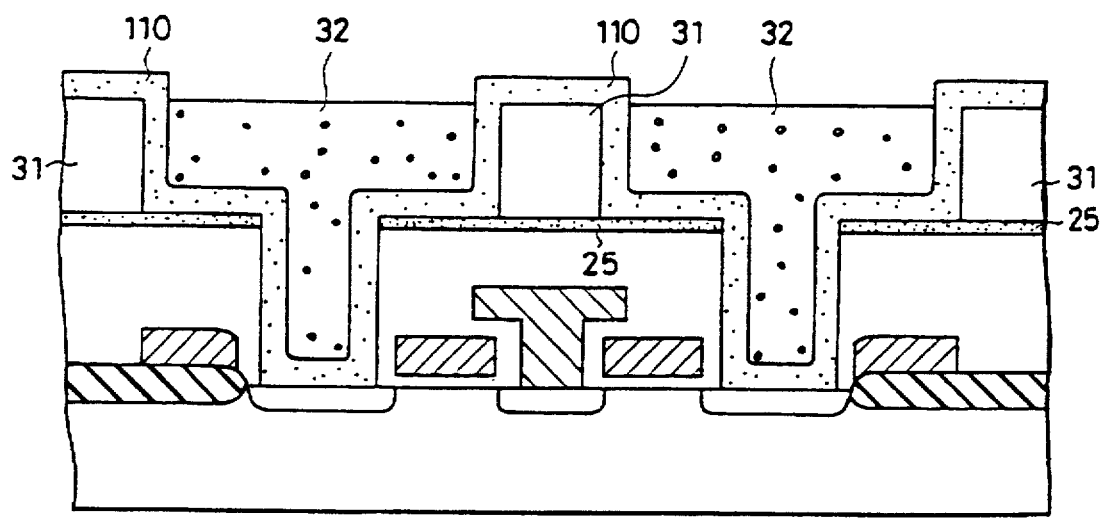

Then, as shown in FIG. 5E (corresponding to FIG. 3J), the resist 32 is etched back to expose the surface of the polycrystalline silicon layer 110.

Figure 5F:
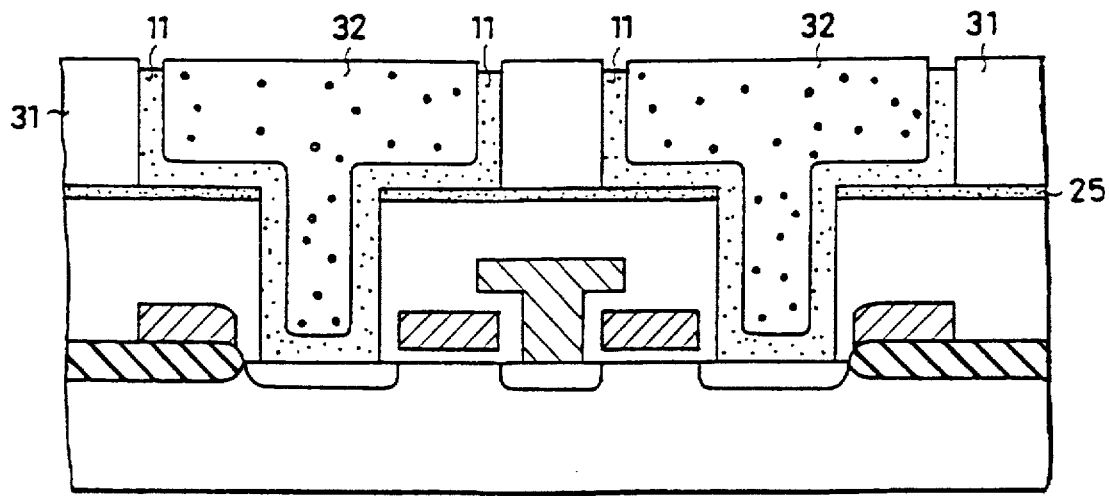

Then, as shown in FIG. 5F (corresponding to FIG. 3K), the exposed surface of the polycrystalline layer 110 is selectively removed. As a result, the polycrystalline silicon layer 110 on the surface of the capacitor isolating layer 31 is removed to form the separate lower electrodes 11 and 11 of the capacitor.

Figure 5G:
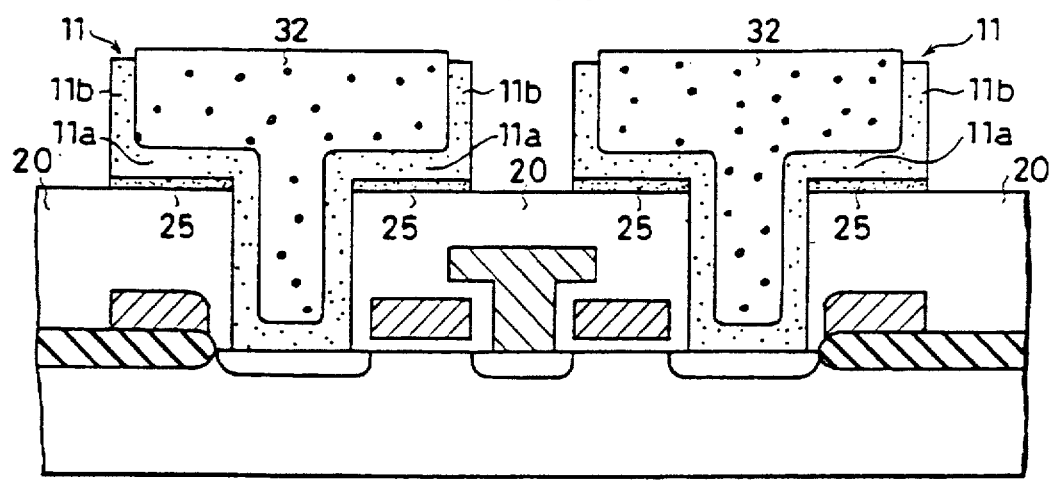

Then, as shown in FIG. 5G, the capacitor isolating layer 31 and the polycrystalline silicon layer 25 located under the capacitor isolating layer 31 are selectively removed. As a result, the adjacent lower electrodes 11 of the capacitor are insulated and isolated from each other.

Figure 5H:
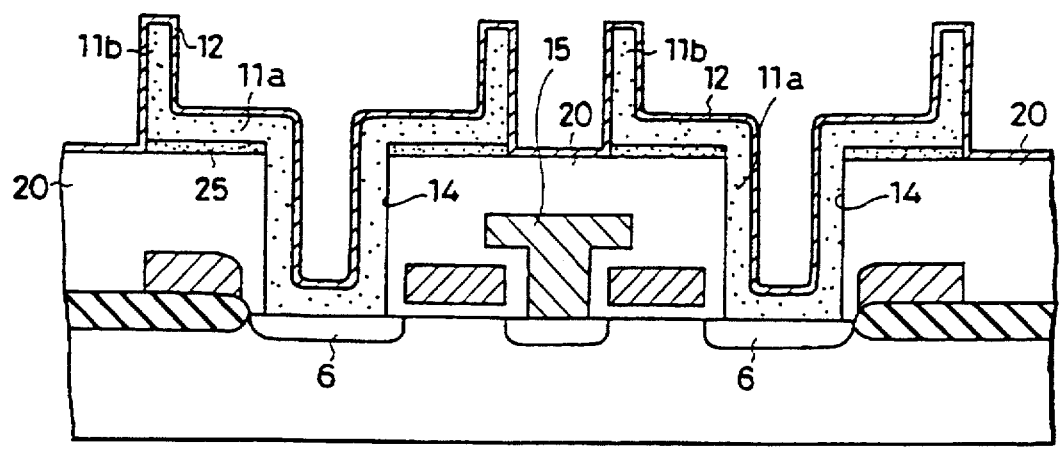

Thereafter, the dielectric 12 is formed on the surface of the lower electrode 11 patterned as shown in FIG. 5H.

While in the above-described first and second embodiments, the resist 32 is used as a layer to be etched back, it is not limited thereto and for example, a CVD silicon oxide film may be used to achieve the same effects.

Figure 6:
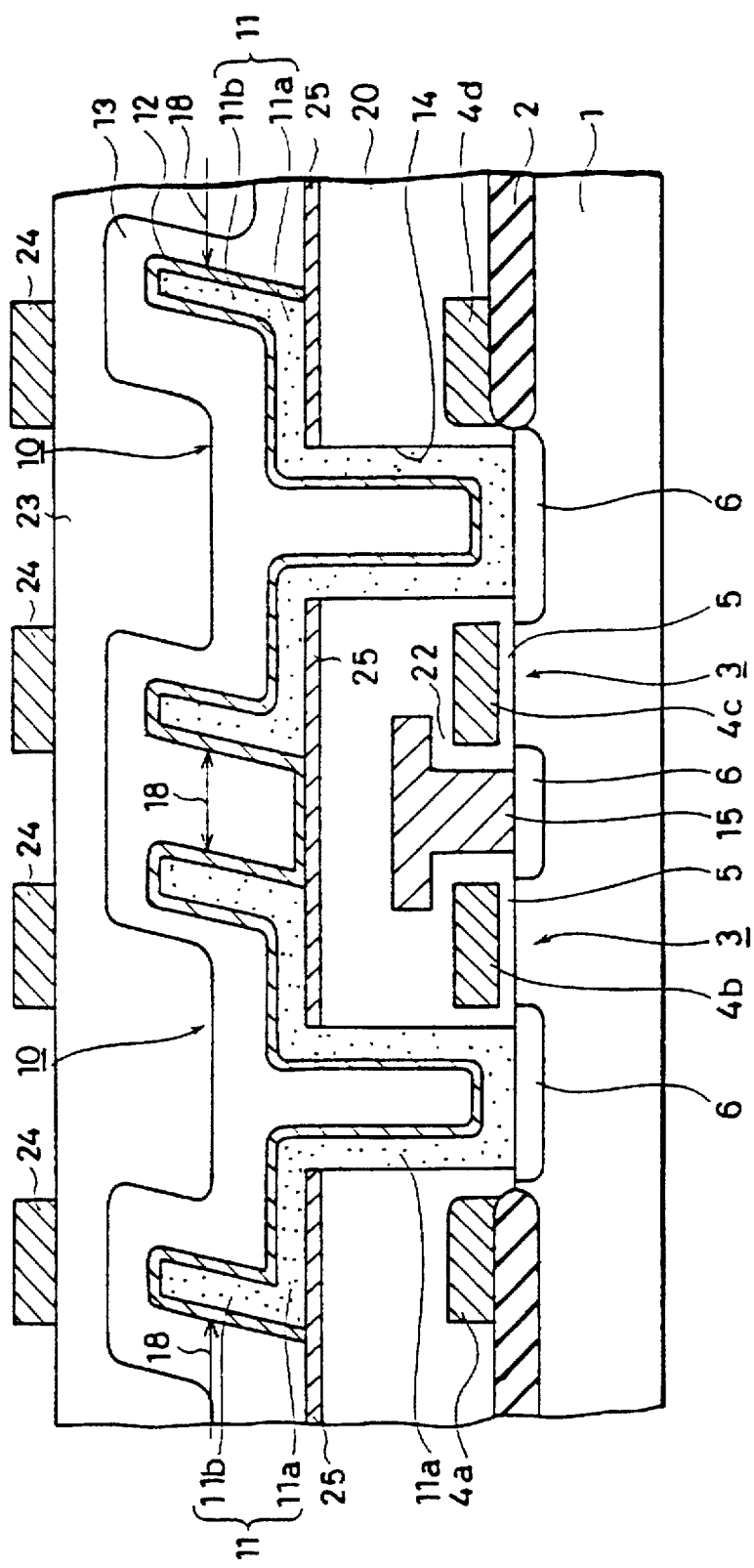
FIG. 6 is a sectional view of an arrangement of memory cells of a DRAM according to a third embodiment of the present invention.

Now, a memory cell of a DRAM according to a third embodiment of the present invention will be described. FIG. 6 is a sectional view of the arrangement of the memory cell corresponding to FIG. 2 showing the first embodiment.

Referring to FIG. 6, the third embodiment is characterized in that the standing wall portion 11b of the lower electrode 11 of the capacitor 10 is formed extending in a direction oblique to the major surface of the substrate. More specifically, the standing wall portion 11b is shaped into a hallow oblique elliptic cylinder or a hollow oblique circular cylinder, or a hollow oblique prism. Then, both inner and outer surfaces of the slant standing wall portion 11b are used as capacitance portions. Assuming that a vertical height of the standing wall portion 11b of the lower electrode 11 is fixed, the standing wall portion 11b of the capacitor of the third embodiment increases in surface area as compared with the standing wall portion 11b of the first embodiment because the former has a slant surface. Direction and angle of the slant of the standing wall portion 11b can be arbitrarily controlled in the following manufacturing processes.

Figure 7A:
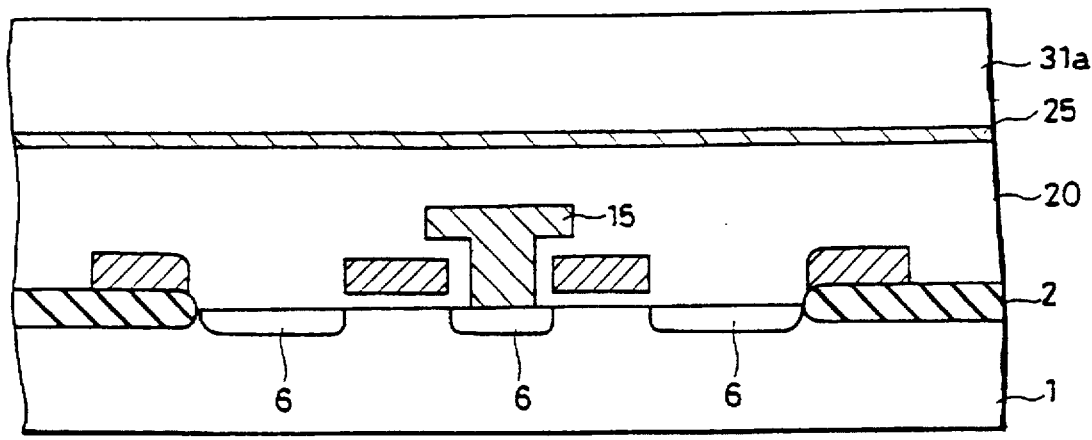
FIGS. 7A, 7B, 7C, 7D, 7E and 7F are sectional views showing main manufacturing steps of the memory cells shown in FIG. 6.

Now, manufacturing steps of the memory cell of the DRAM shown in FIG. 6 will be described. Since the manufacturing steps according to the third embodiment largely overlap with the manufacturing steps of the memory cell of the DRAM according to the first embodiment shown in FIGS. 3A through 3M, description will be made only of the distinctive manufacturing steps and no description will be made of the other manufacturing steps for which the first embodiment is referred to. First, as shown in FIG. 7A (corresponding to FIG. 3F), the polycrystalline silicon layer 25 is deposited on the surface of the interlayer insulation layer 20 by the CVD method. Then, the oxide film 31a is formed on the surface thereof. The polycrystalline silicon layer 25 has an etching selectivity higher than that of the oxide film 31a formed thereon.

Figure 7B:
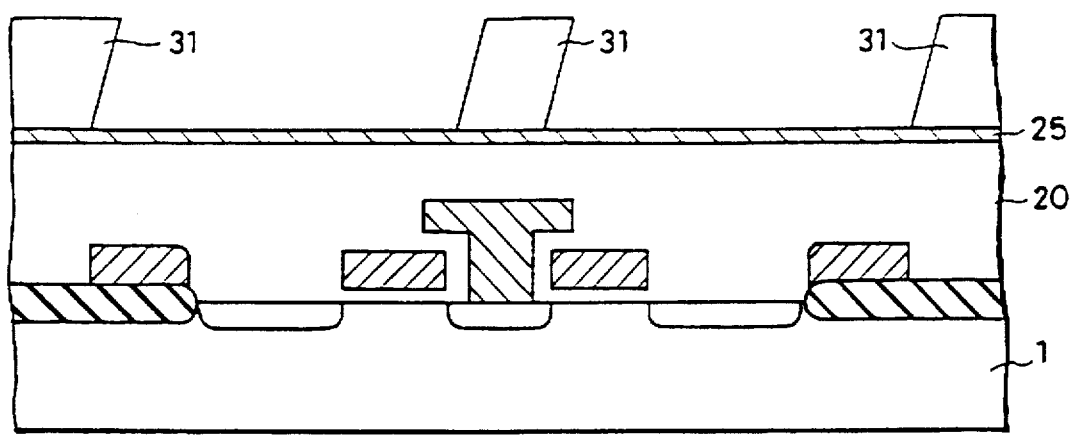

Now, as shown in FIG. 7B (corresponding to FIG. 3G), the oxide film 31a is selectively etched to form the capacitor isolating layer 31 slanting with respect to the major surface of the substrate. For example, plasma etching is used as an etching method. The semiconductor substrate 1 is supported such that the major surface of the substrate is slanted with respect to the direction of ion injection in the plasma. In this state, by etching the oxide film 31a, the capacitor isolating layer 31 can be formed to slant in arbitrary direction and angle with respect to the major surface of the substrate. The direction and angle of the slant are set such that the slant surface area of the standing wall portion 11a of the lower electrode becomes maximum.

Figure 7C:
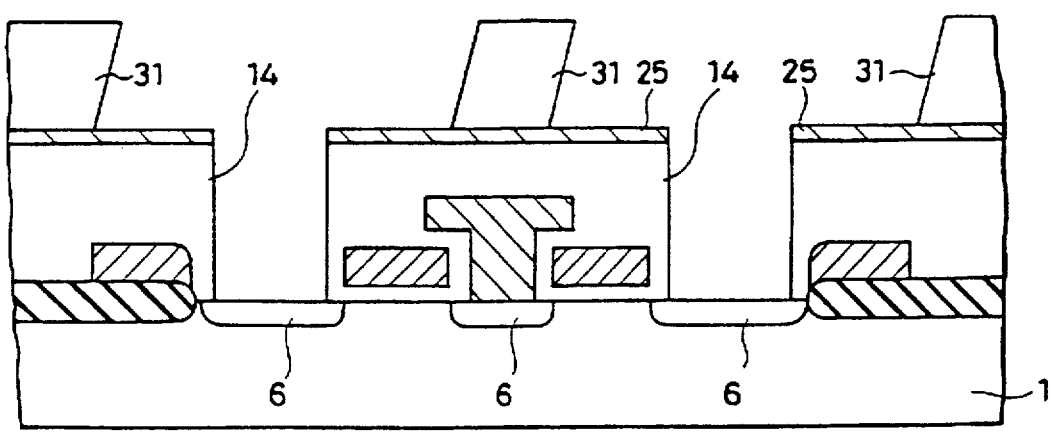

Then, as shown in FIG. 7C (corresponding to FIG. 3H), the contact hole 14 reaching the source and drain regions 6 and 6 is formed in the polycrystalline silicon layer 25 and the interlayer insulation layer 20 by the photolithography method and the etching method.

Figure 7D:
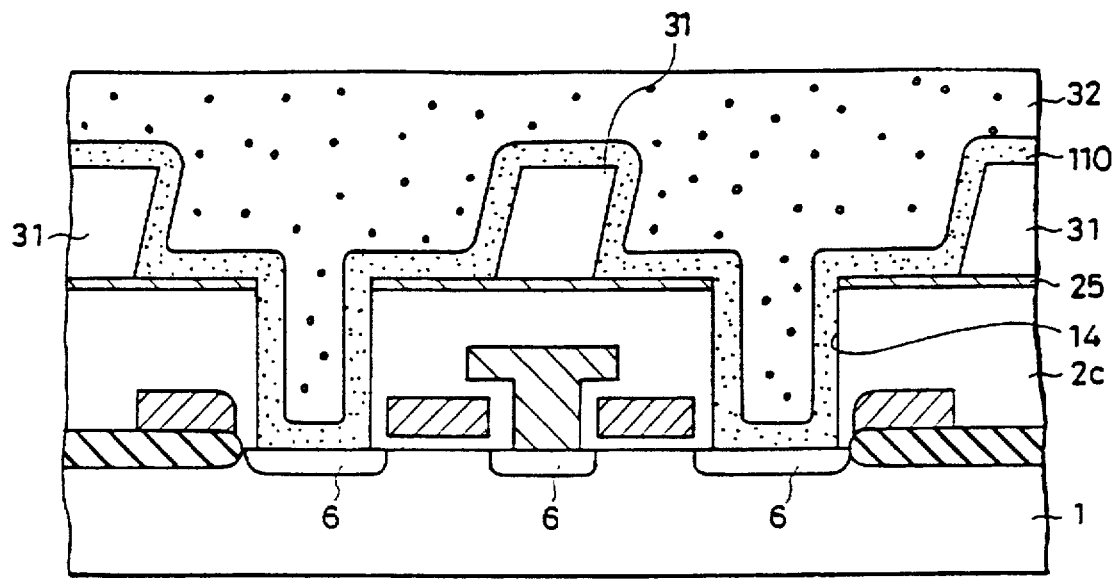

In addition, as shown in FIG. 7D (corresponding to FIG. 3I), the polycrystalline silicon layer 110 is deposited on the inner surface of the contact hole 14 and on the surfaces of the polycrystalline silicon layer 25 and the capacitor isolating layer 31 having the slant side surface. Then, the thick resist 32 is applied on a surface of the polycrystalline silicon layer 110.

Figure 7E:
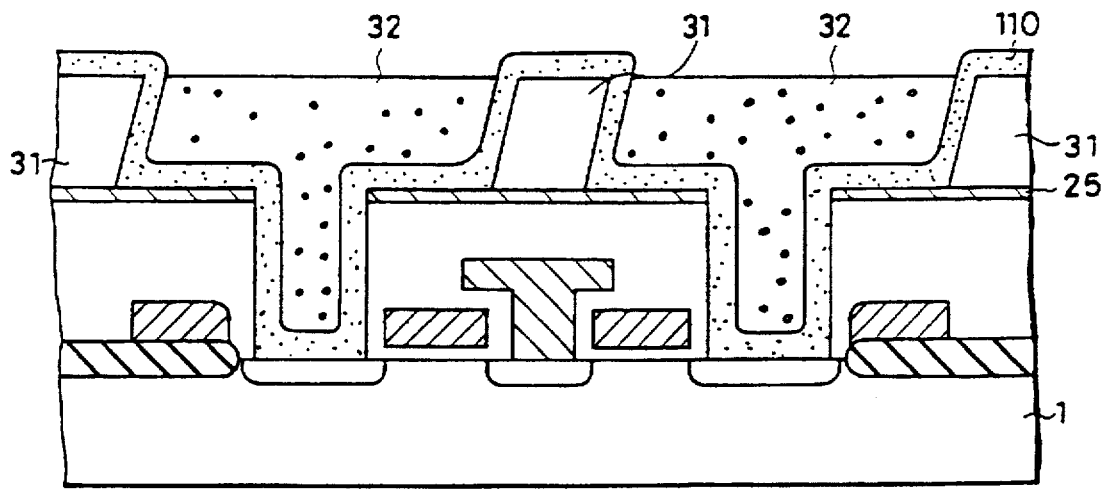

Furthermore, as shown in FIG. 7E (corresponding to FIG. 3J), the resist 32 is etched back to expose the surface of the polycrystalline silicon layer 110.

Figure 7F:
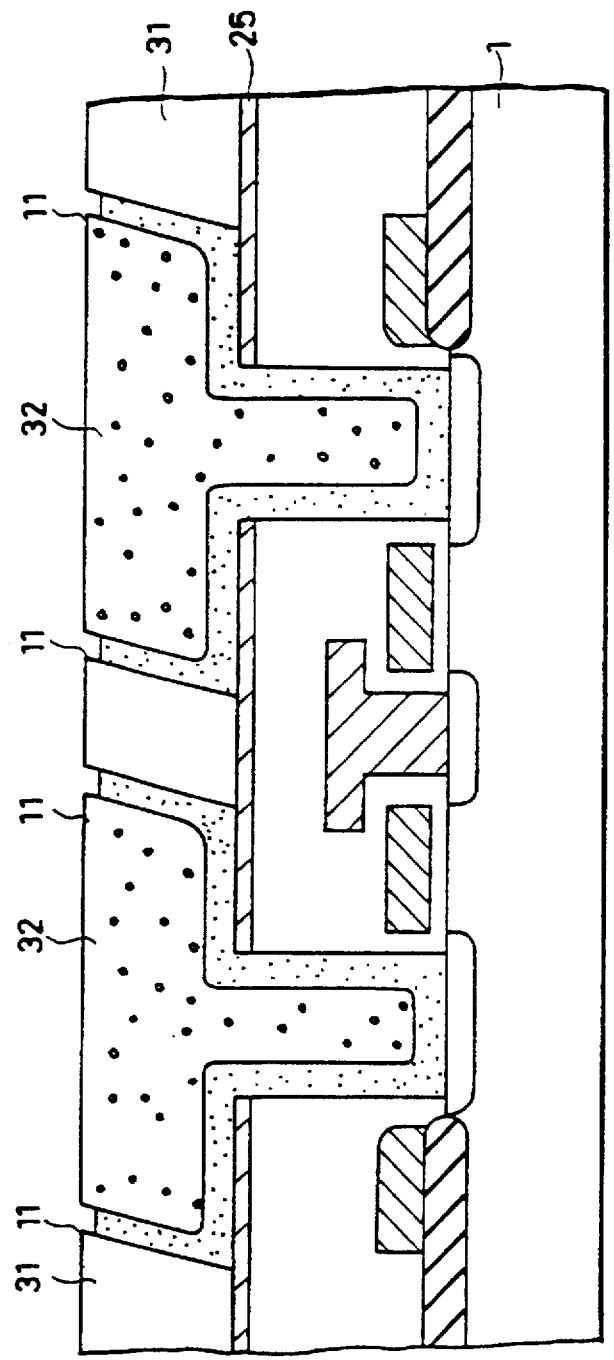

Then, as shown in FIG. 7F (corresponding to FIG. 3K), the exposed surface of the polycrystalline silicon layer 110 is selectively removed. As a result, the polycrystalline silicon layer 110 on the surface of the capacitor isolating layer 31 is removed to form the separate lower electrodes 11 and 11 of the capacitor.

Thereafter, through the same steps as shown in FIGS. 3L and 3M, the memory cell shown in FIG. 6 is completed.

Figure 8:
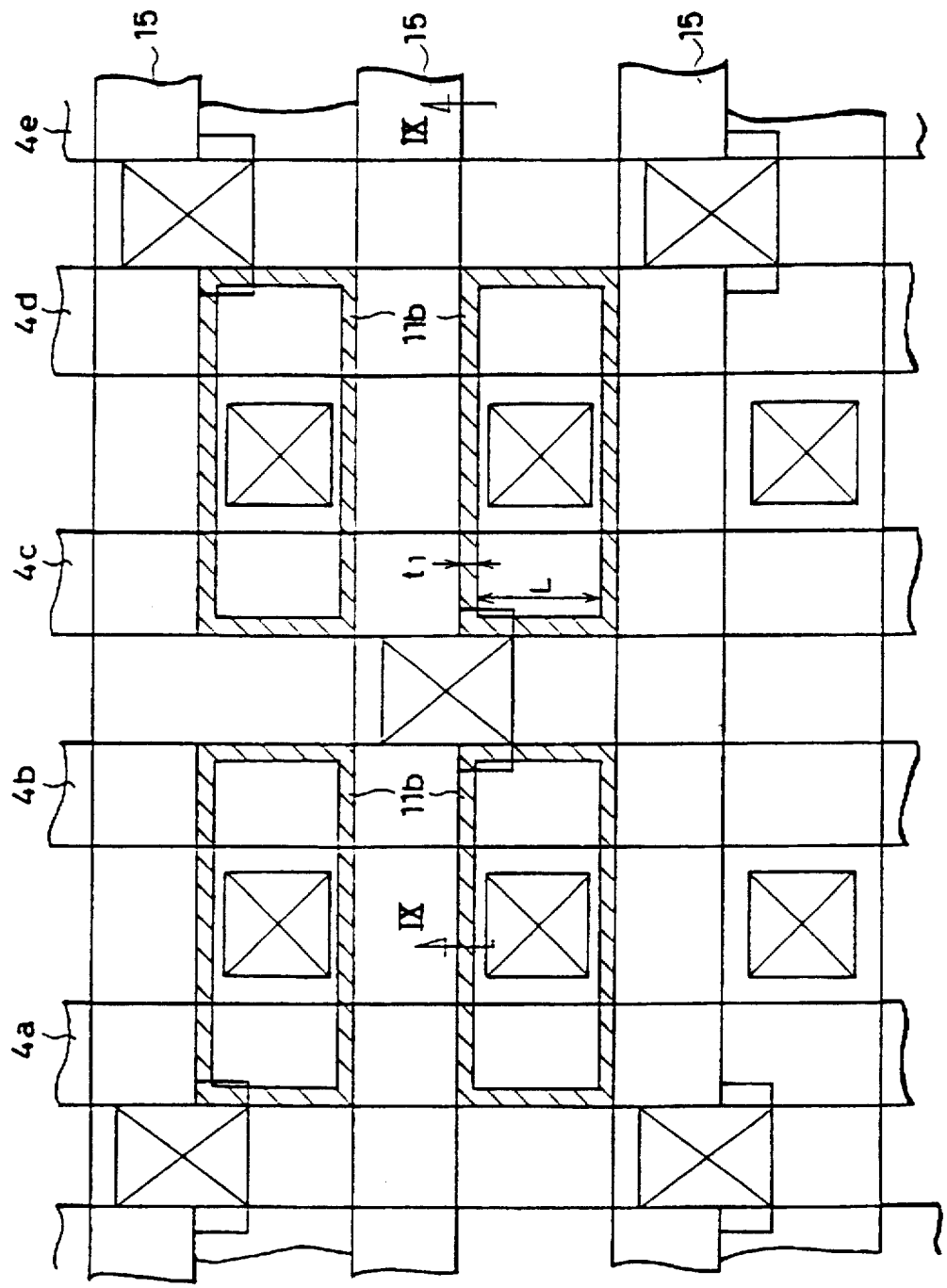
FIG. 8 is a view showing a plane arrangement of a memory cell array according to a fourth embodiment of the present invention.
Figure 9:
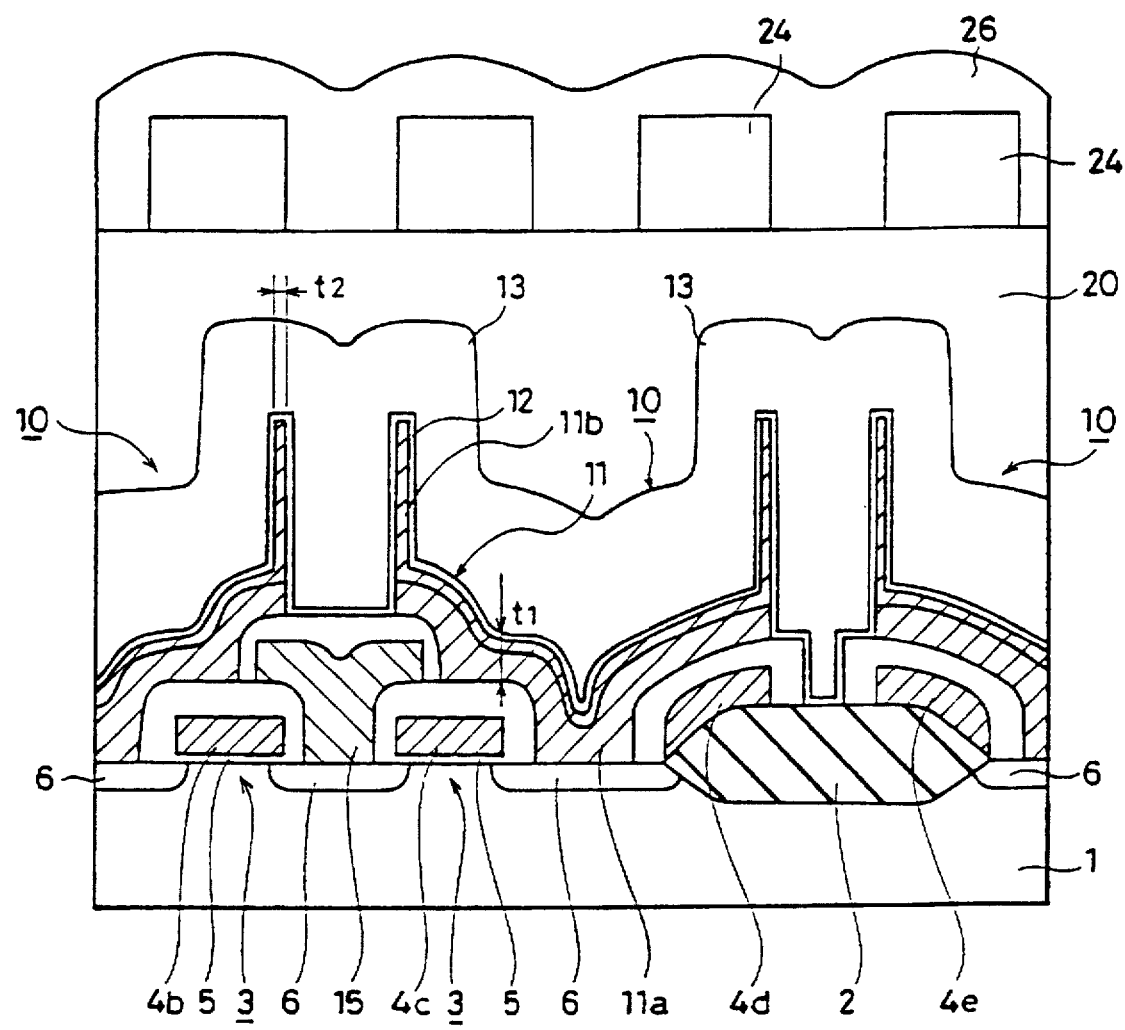
FIG. 9 is a sectional view of an arrangement taken long a line IX—IX in FIG. 8.

Now, a fourth embodiment of the present invention will be described. FIG. 8 is a plan view of an arrangement of a memory cell array according to the fourth embodiment and FIG. 9 is a diagram of a sectional view of the arrangement taken along a line IX—IX of FIG. 8. Referring to both the drawings, the arrangement of the memory cell according to the third embodiment is characterized in that the base portion 11a and the standing wall portion 11b of the lower electrode 11 of the capacitor 10 differ from each other in film thickness. A film thickness $t_1$ of the base portion 11a of the lower electrode 11 is set to be relatively thick such that mainly resistance as the electrode layer can be reduced. As an example, the film thickness is set to about 2000 Å. A film thickness $t_2$ of the standing wall portion 11b of the lower electrode 11 of the capacitor 10 is settled in consideration of the following two points. First point is to make the film thickness as thin as possible so as to make an inner diameter L of the standing wall portion 11b of the lower electrode 11 as large as possible and make the area of the inner wall surface larger. On the contrary, the second point is to ensure a film thickness large enough not to allow the standing wall portion 11b to have resistance too high to serve as a capacitance region due to the depletion layer extending in the standing wall portion 11b during the operation. As an example, the film thickness is set to about 500 Å. In addition, similarly in the first and second embodiments, an outer side surface of the standing wall portion 11b is registered with the outermost periphery of the base portion 11a and vertically and upwardly protrudes. While the first electrode layer 11 is formed into a rectangle in FIG. 8, in practice it may be formed to have four round corners or to be oval or cylindrical.

Figure 10A:
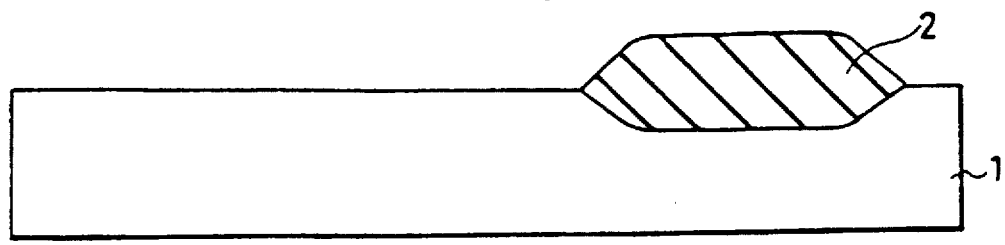
FIGS. 10A, 10B, 10C, 10D, 10E, 10F, 10G, 10H, 10I, 10J, 10K, 10L, 10M and 10N are sectional views showing manufacturing steps of the memory cell shown in FIG. 9.

Now, manufacturing steps of the memory cell shown in FIG. 9 will be described. FIGS. 10A through 10N are sectional views showing the manufacturing steps of the memory cell shown in FIG. 9.

First, as shown in FIG. 10A, the field oxide film 2 and the channel stopper region (not shown) are formed in predetermined regions on the main surface of the silicon substrate 1. The field oxide film 2 is formed by the LOCOS method.

Figure 10B:
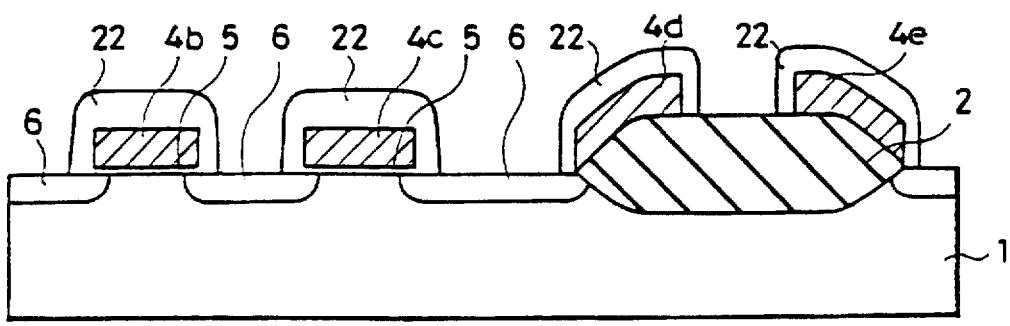

Now, as shown in FIG. 10B, after the formation of the gate insulation layer 5 by the thermal oxidation process or the like, the gate electrodes (word lines) 4b, 4c, 4d and 4e formed of polycrystalline silicon are selectively formed. Then, the insulation layer 22 is formed around the gate electrodes 4b–4e through the two cycles of the depositing and etching steps of the oxide film. Furthermore, the impurity ions are implanted in the surface of the silicon substrate 1 by ion implantation method, using the gate electrodes 4b and 4c covered with the insulation layer 22 as masks, to form the source and drain regions 6 and 6.

Figure 10C:
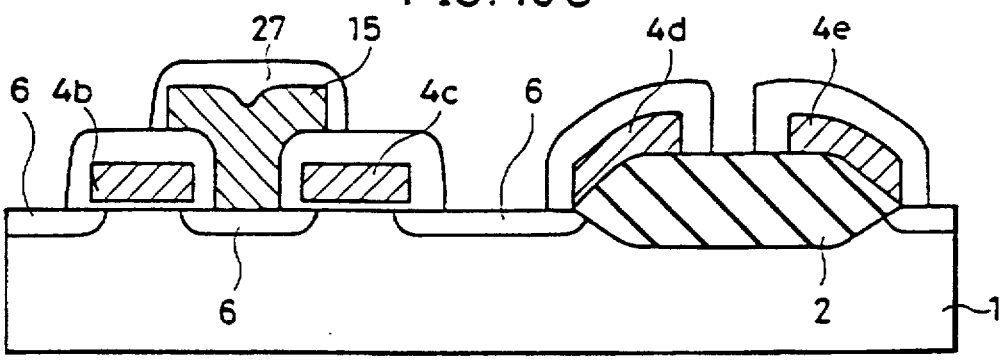

Then, as shown in FIG. 10C, high melting point metal layers such as tungsten, molybdenum and titanium are deposited and patterned into a predetermined configuration. As a result, the bit line 15 directly contacting one of the source and drain regions 6 of the transfer gate transistor is formed. High melting point metal silicide or polycide may be used as a material of the bit line 15. Furthermore, the periphery of the bit line 15 is coated with an insulation layer 27.

Figure 10D:
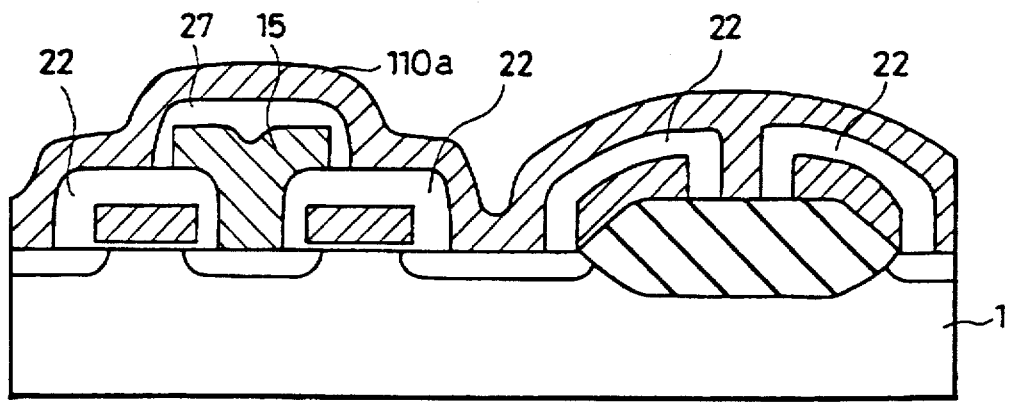

Then, as shown in FIG. 10D, a polycrystalline silicon layer 110a in which the impurities such as phosphorus or arsenic are implanted by the CVD method is deposited on the whole surface of the silicon substrate 1. More than $10^{20}$/cm$^3$ of impurities are introduced in the polycrystalline silicon layer 110a.

Figure 10E:
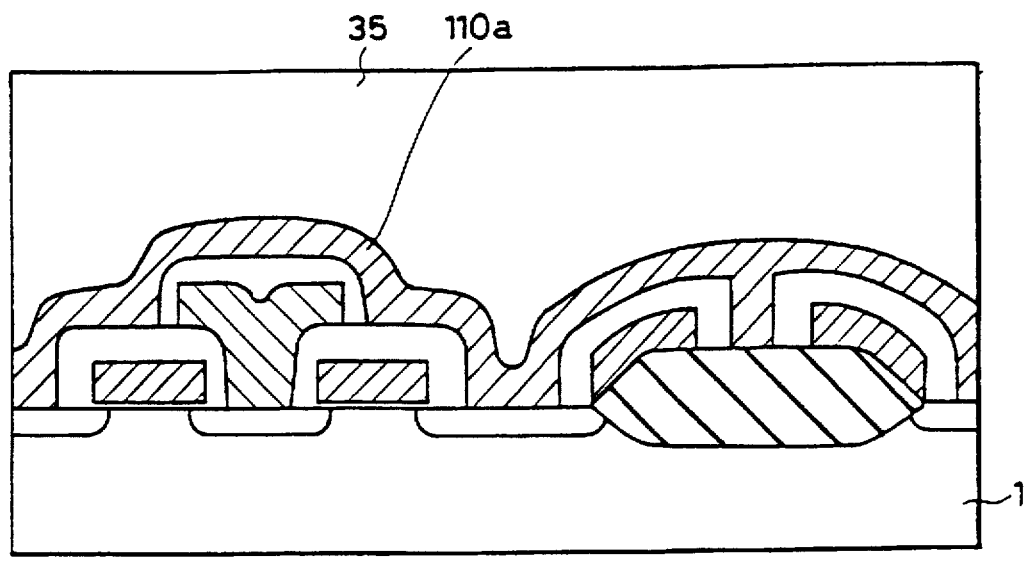

Furthermore, as shown in FIG. 10E, a thick insulation layer 35, for example, of a silicon oxide film is deposited. The film thickness of the insulation layer 35 will define a height of the standing wall portion 11b of the lower electrode 11 of the capacitor.

Figure 10F:
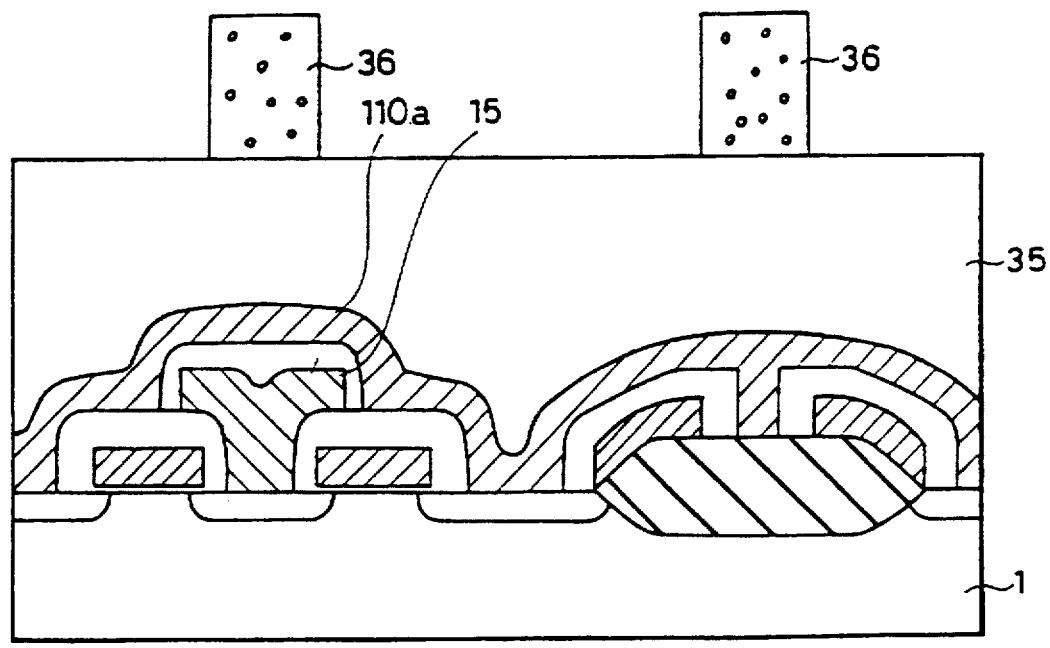

Then, as shown in FIG. 10F, a resist 36 is applied on a surface of the insulation layer 35, which is patterned into a predetermined configuration by the lithography method or the like. As a result, a resist pattern (capacitor isolating layer) 36 formed of the resist 36 is formed. The width of the resist pattern 36 will define an isolation distance between the adjacent capacitance.

Figure 10G:
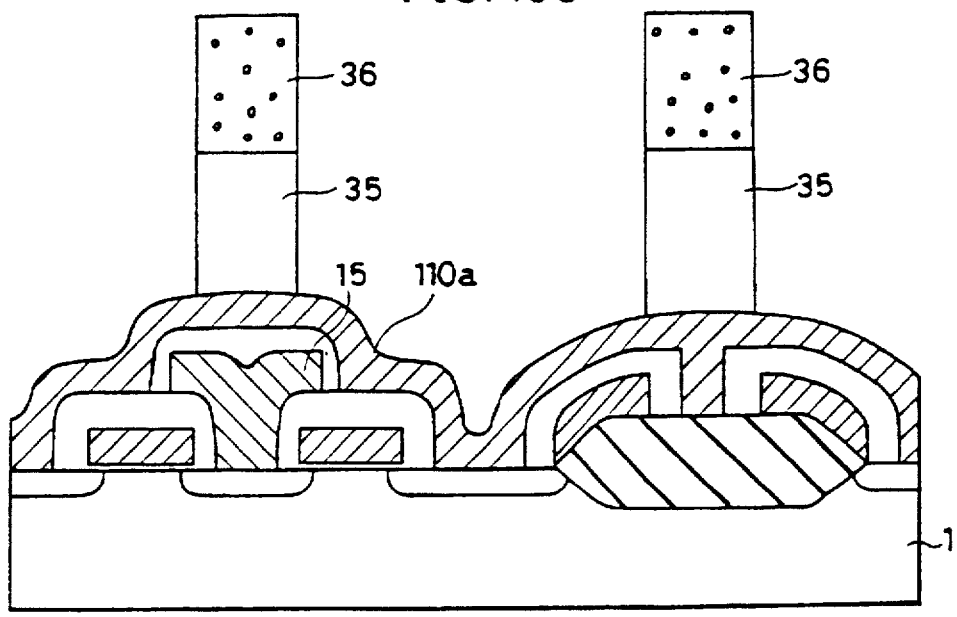

Then, as shown in FIG. 10G, the insulation layer 35 is selectively removed by using the resist pattern 36 as a mask. The etching is carried out based on, for example, the anisotropic etching. When the width of the insulation layer 35 needs to be smaller than that of the resist pattern 36, wet etching or the like may be additionally carried out.

Figure 10H:
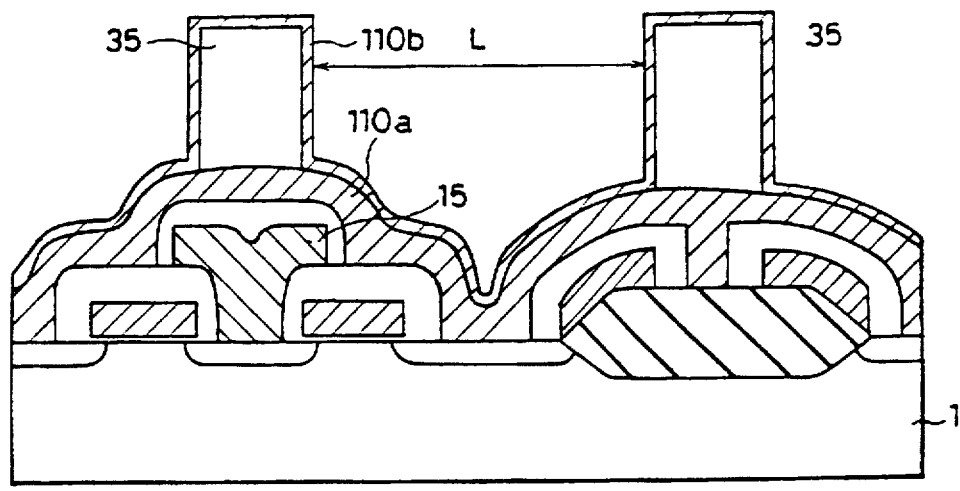

Then, as shown in FIG. 10H, after the removal of the resist pattern 36, a polycrystalline silicon layer 110b with the impurities implanted therein is deposited on the whole surface by the CVD method. The polycrystalline silicon layer 110b is formed to have a film thickness smaller than that of the first polycrystalline silicon layer 110a formed thereunder. Namely, the second polycrystalline silicon layer 110b is formed to have a film thickness allowing the inner diameter indicated by L in the drawing to be made as large as possible. For example, it is formed to have a film thickness of about 500 Å. The polycrystalline silicon layer 110b also has impurity having concentration of more than $10^{20}/cm^3$ implanted therein.

Figure 10I:
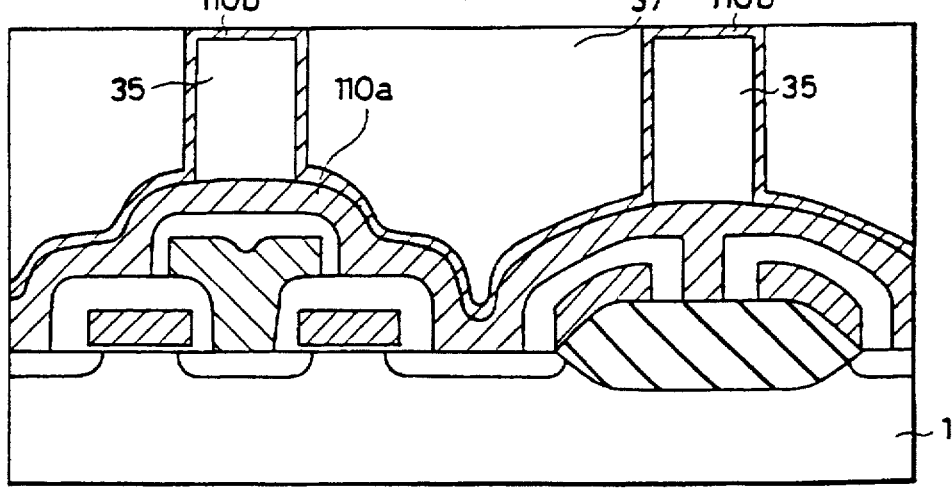

Then, as shown in FIG. 10I, a thick resist 37 is applied so as to fully cover the surface of the second polycrystalline silicon layer 110b. Then, a part of the second polycrystalline silicon layer 110b which covers an upper surface of the insulation layer 35 is exposed by etching back the resist 37.

Figure 10J:
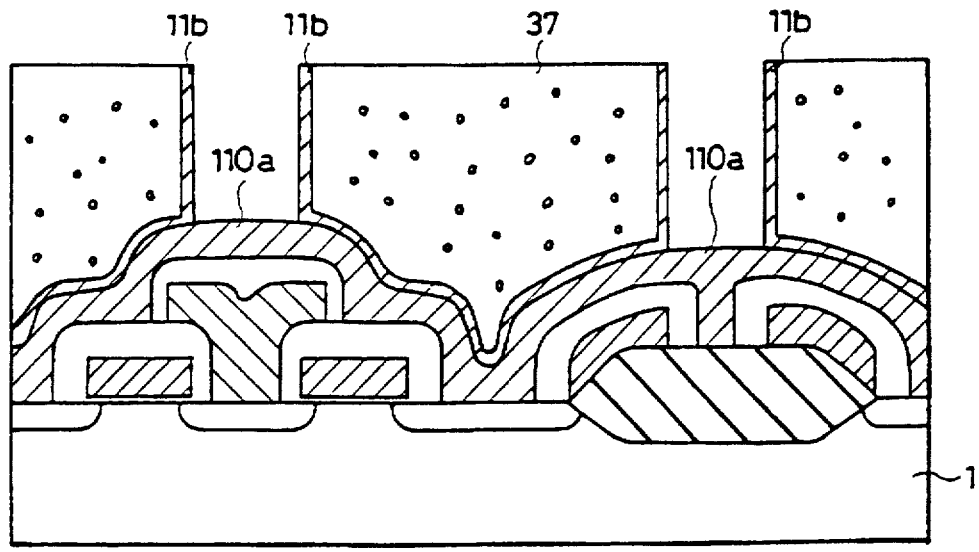

Then, as shown in FIG. 10J, the second polycrystalline silicon layer 110b exposed in the surface of the resist 37 is etched and subsequently the insulation layer 35 is removed by etching in a self-alignment manner. A surface of the first polycrystalline silicon layer 110a is exposed inside the opening from which the insulation layer 35 is removed by etching.

Figure 10K:
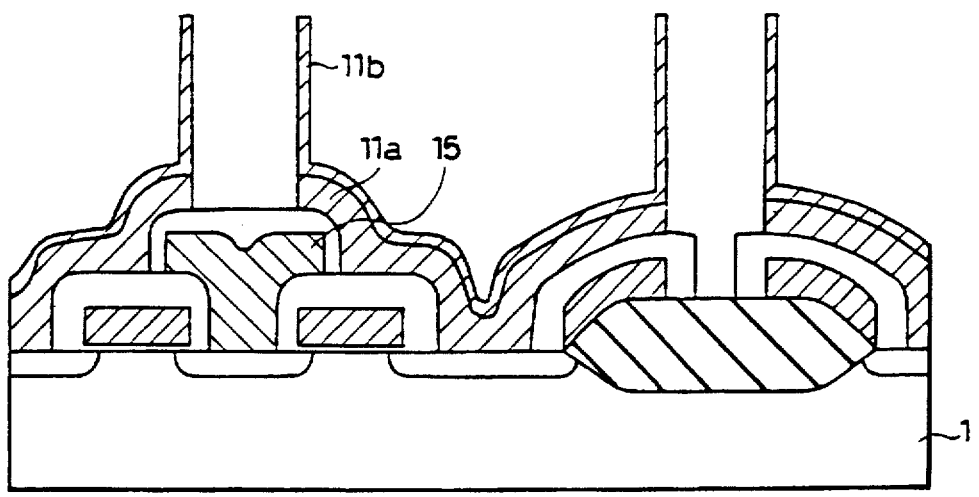

Then, as shown in FIG. 10K, only the exposed region of the polycrystalline silicon layer 110a is removed by anisotropic etching in the self-alignment manner. Thereafter, the resist 37 is removed. In this step, the base portion 11a and the standing wall portion 11b of the lower electrode 11 of the capacitor are formed.

Figure 10L:
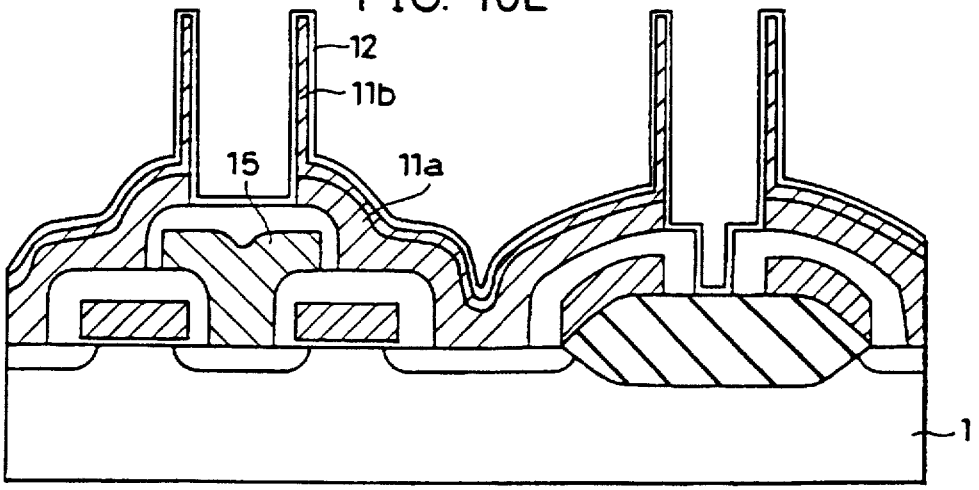

Then, as shown in FIG. 10L, a thin insulation layer such as a silicon nitride film, or a silicon oxide film, or a composite film thereof, or tantalum, or pentoside ($Ta_2O_5$), or hafnium oxide film ($HaO_2$) is applied as a dielectric layer on the surface of the lower electrode 11 or the like.

Figure 10M:
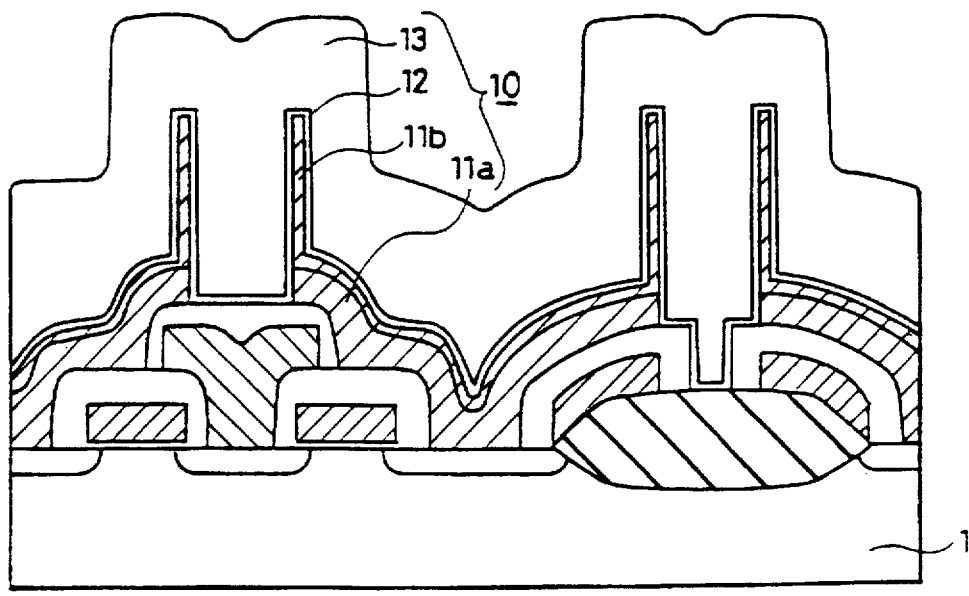
Figure 10N:
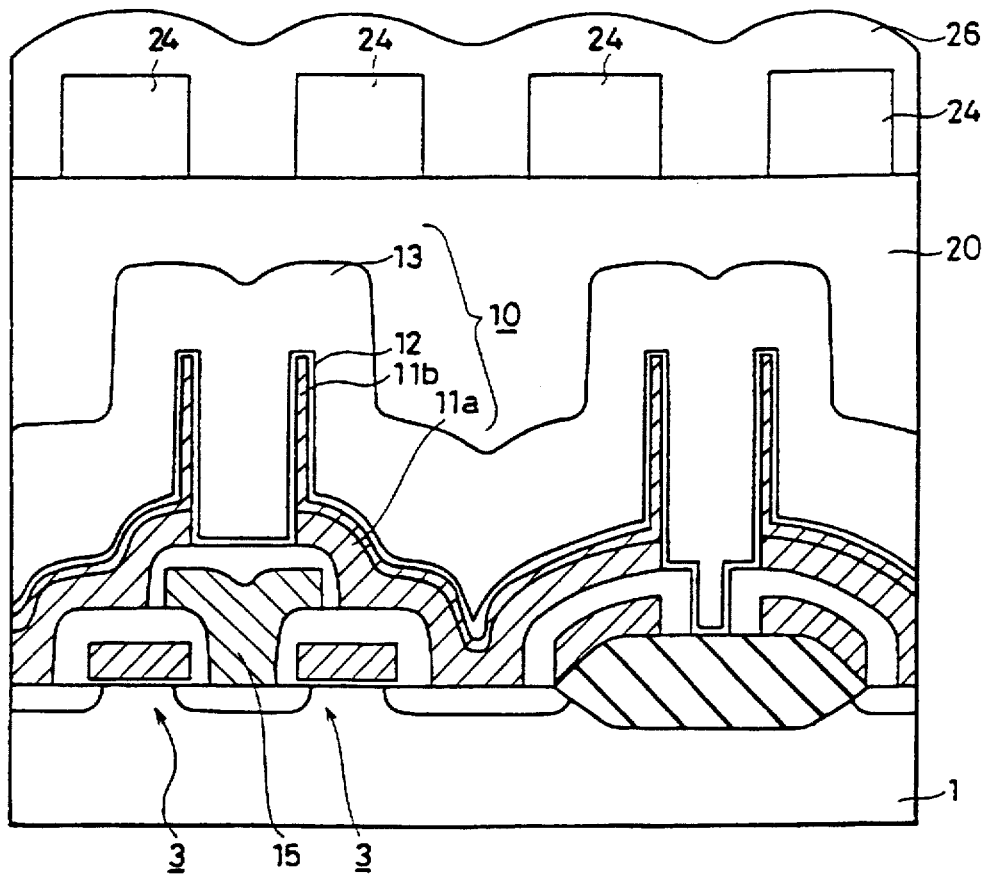
Figure 11:
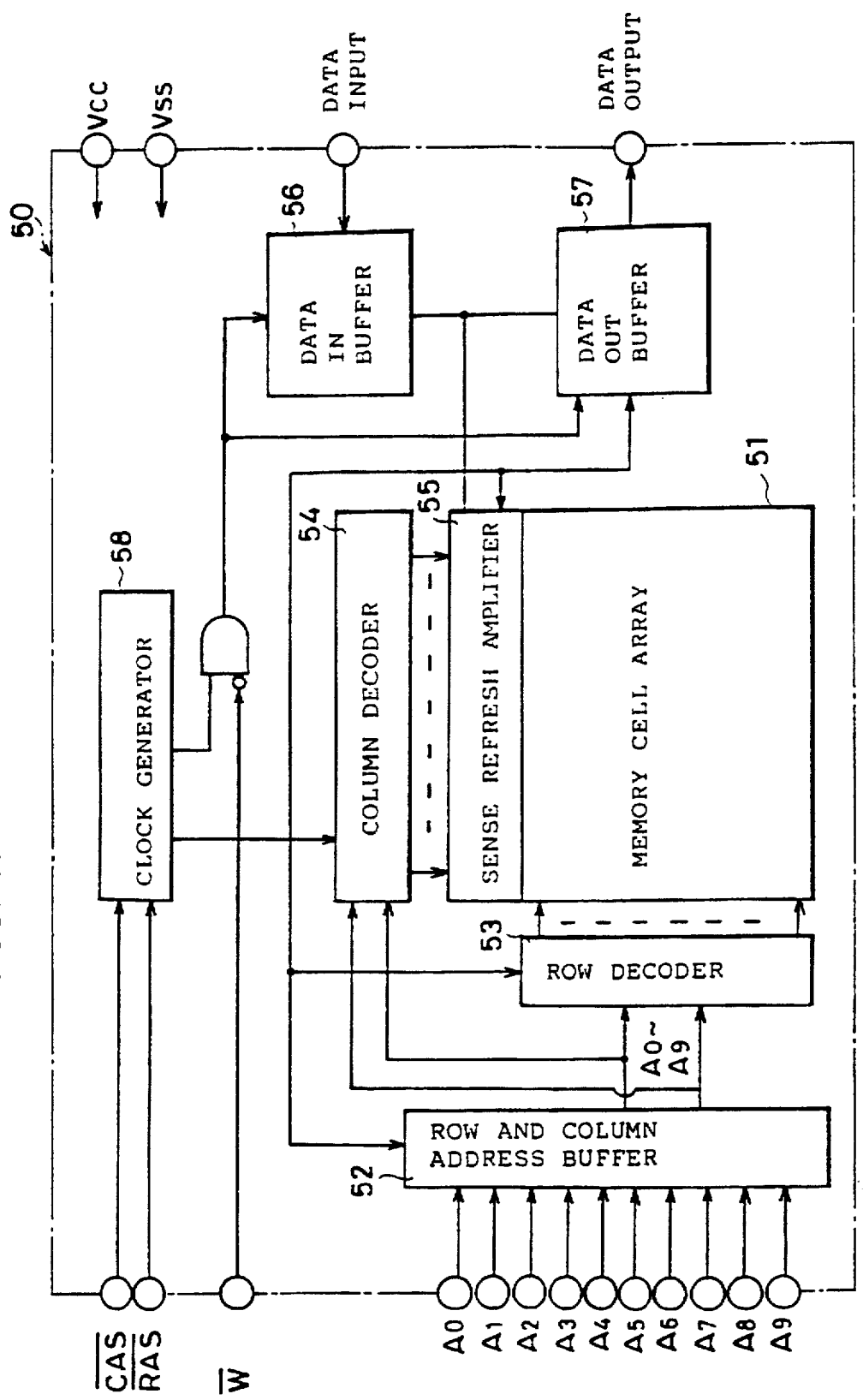
FIG. 11 is a block diagram of a conventional DRAM.
Figure 12:
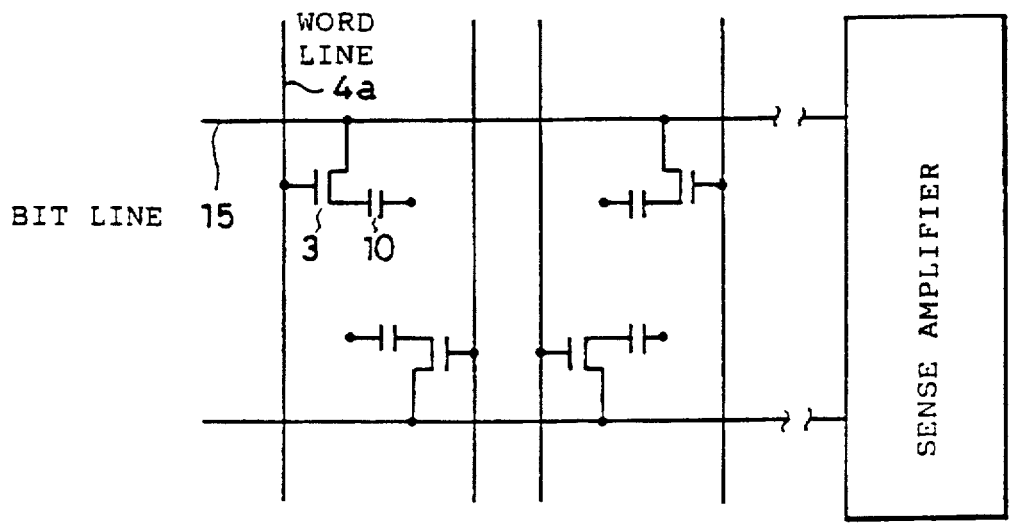
FIG. 12 is an equivalent circuit diagram of memory cells of the conventional DRAM.
Figure 13:
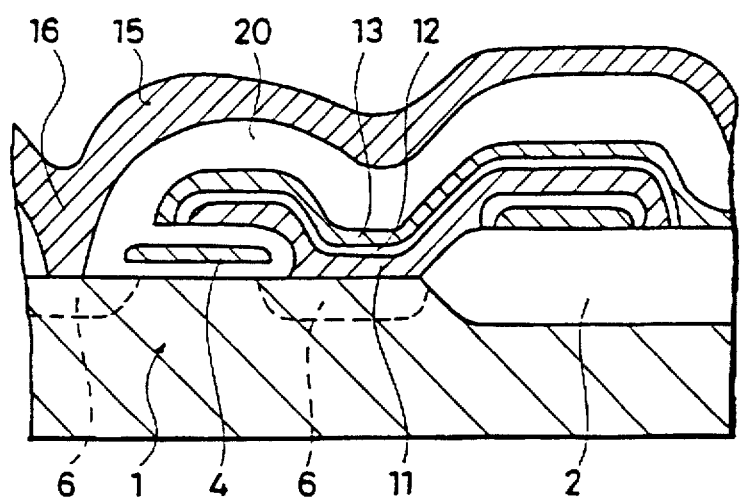
FIG. 13 is a sectional view of an arrangement of a memory cell of a DRAM comprising a stacked type capacitor according to a conventional example.
Figure 14:
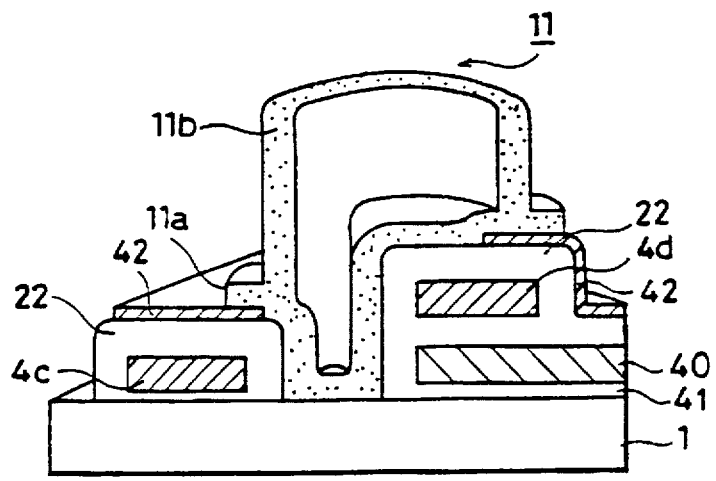
FIG. 14 is a sectional view of an arrangement of a memory cell of a DRAM according to another conventional embodiment.
Figure 15A:
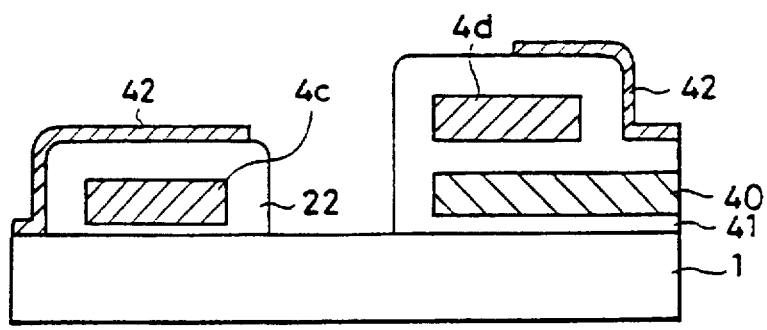
FIGS. 15A, 15B, 15C, 15D, 15E and 15F are sectional views showing manufacturing steps of the memory cell of the DRAM shown in FIG. 14.
Figure 15B:
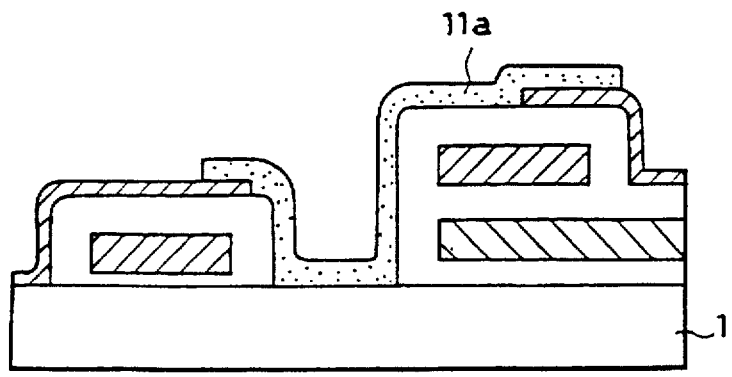
Figure 15C:
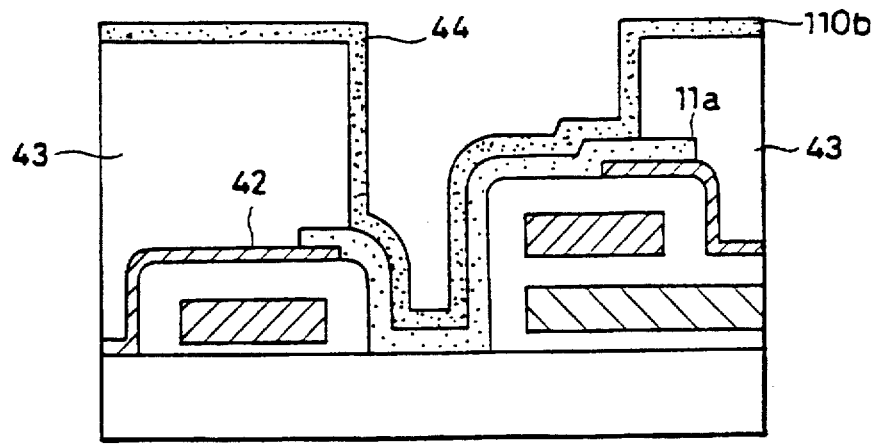
Figure 15D:
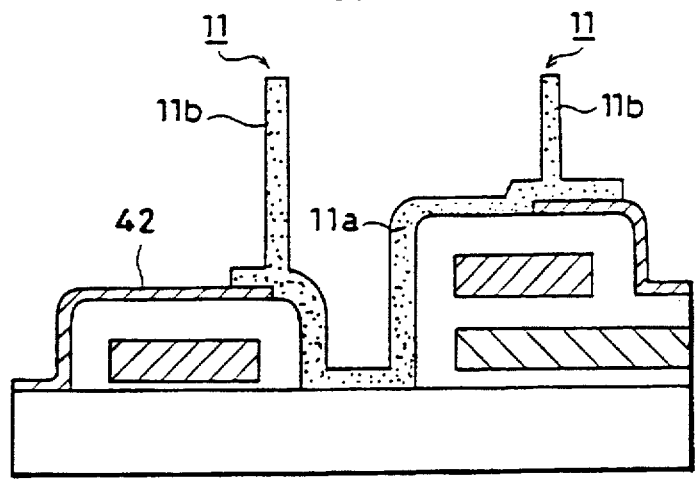
Figure 15E:
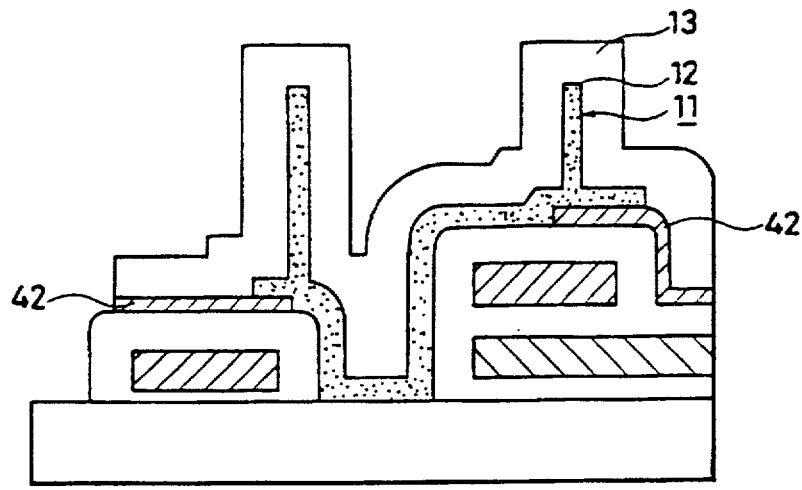
Figure 15F:
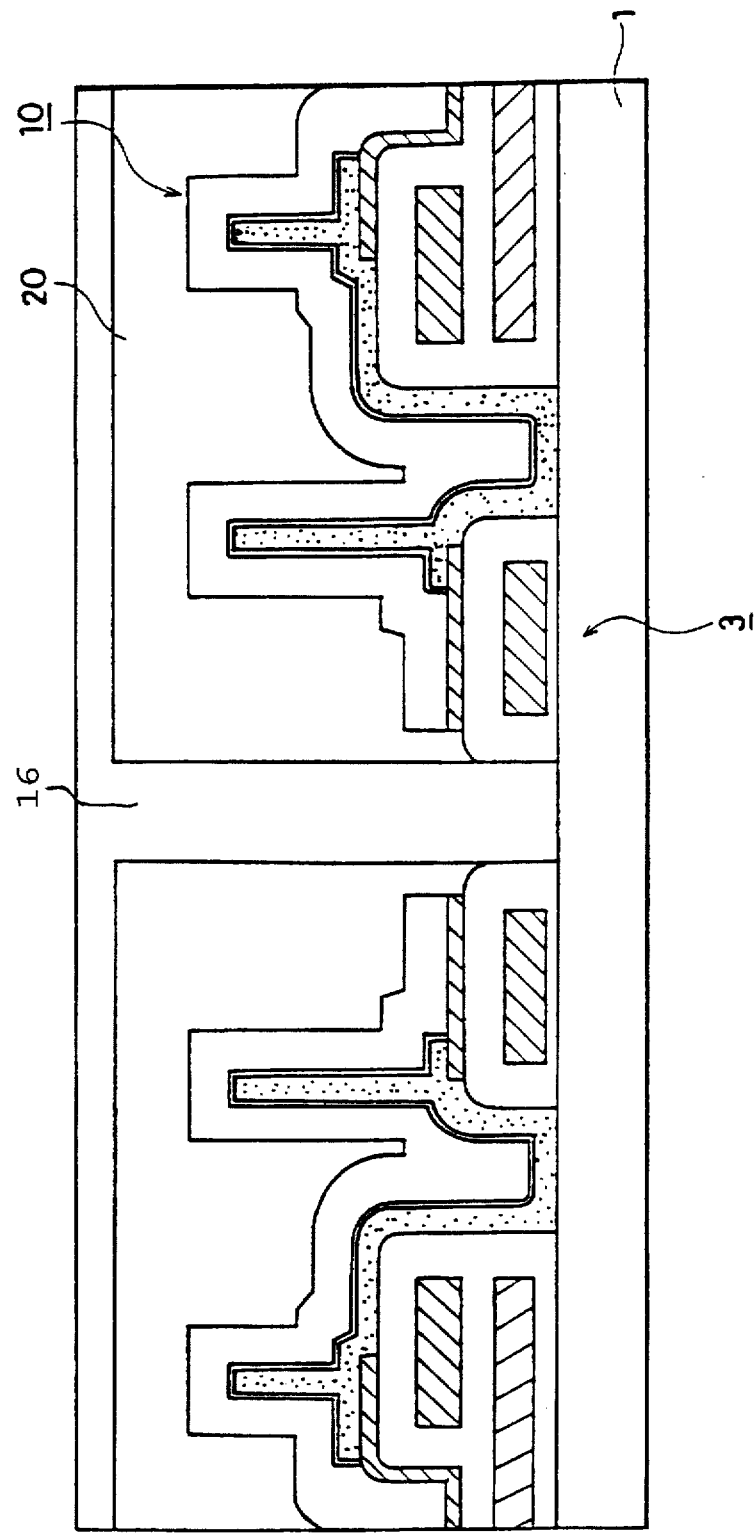
Figure 16:
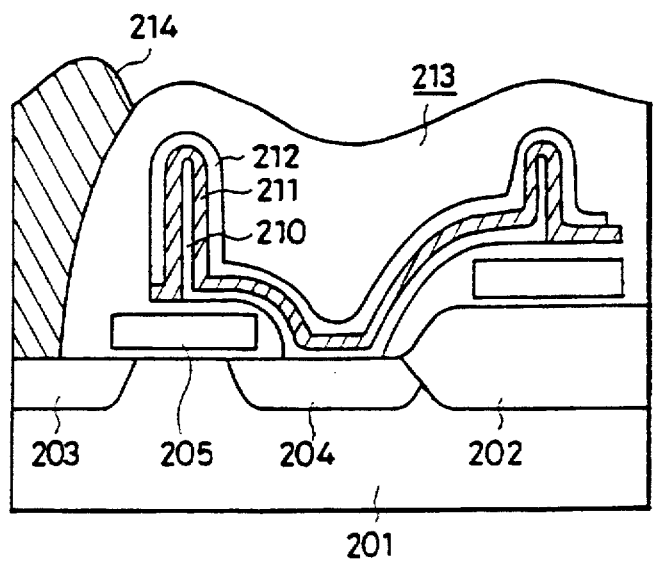
FIG. 16 is a sectional view of an arrangement of a memory cell of a DRAM according to still another conventional embodiment.
Figure 17A:
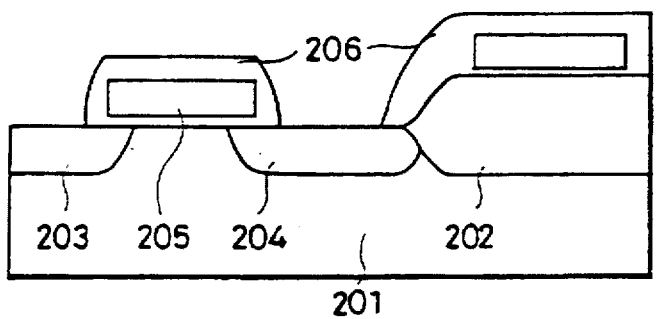
FIGS. 17A, 17B, 17C and 17D are sectional views showing manufacturing steps of the memory cell of the DRAM shown in FIG. 16.
Figure 17B:
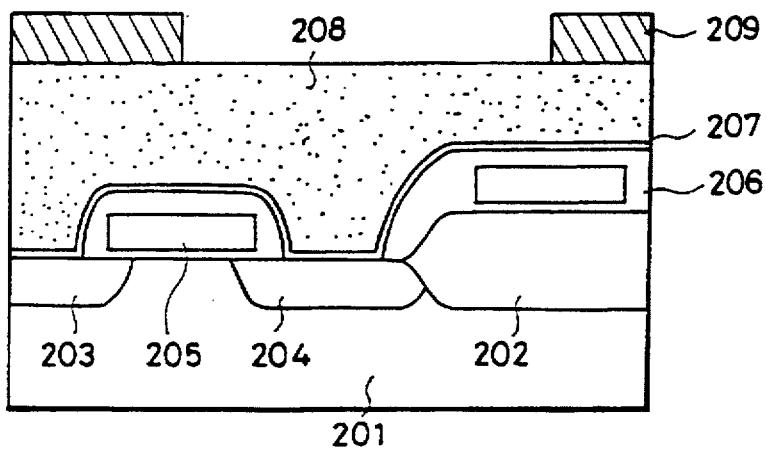
Figure 17C:
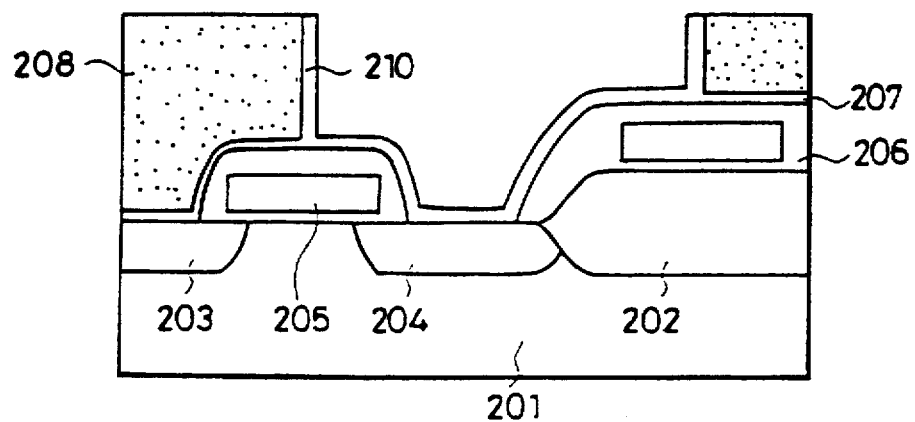
Figure 17D:
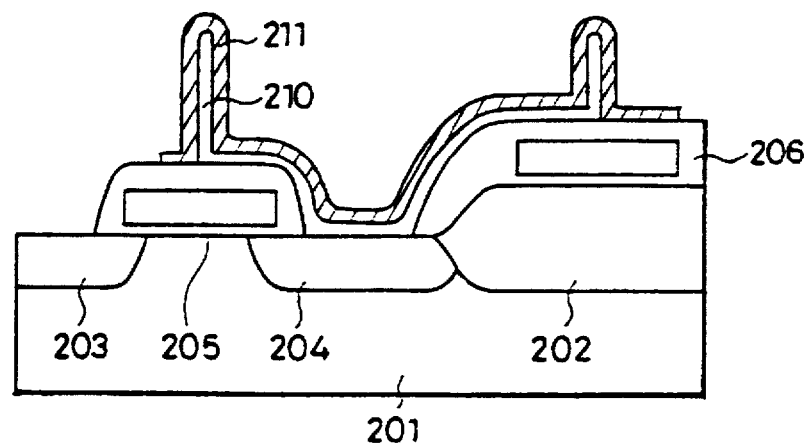

Then, as shown in FIG. 10M, the upper electrode (cell plate) 13 comprising a conductive polycrystalline silicon layer or the like is formed on the whole surface. High melting point metal or the like may be used as the cell plate.

Then, as shown in FIG. 10N, the upper electrode 13 is covered with the thick interlayer insulation layer 20. Then, a contact hole is formed in a predetermined region of the interlayer insulation layer 20 and a conductor formed of such as polycrystalline silicon or tungsten is buried in the contact hole (not shown). Then, the interconnection layer 24 of a predetermined configuration comprising aluminum or the like is formed on the surface of the interlayer insulation layer 20. The memory cell is manufactured through the above described steps.

As the foregoing, in the fourth embodiment, the lower electrodes 11 isolated from each other of the capacitor are formed in a self-alignment manner by using the insulation layer (capacitor isolating layer) 35 formed by one cycle of the patterning. Then, a distance between the adjacent capacitors can be controlled and settled by the width of this insulation layer 35. Furthermore, the base portion 11a and the standing wall portion 11b of the lower electrode 11 of the capacitor 10 are manufactured through the different depositing steps. Accordingly, each film thickness can be easily settled. Furthermore, materials of the base portion 11 and the standing wall portion 11b can be easily changed. For example, various combinations are applicable such as a combination of high melting point metal or high melting point metal silicide as the base portion 11a and polycrystalline silicon as the standing wall portion 11b and vice versa.

In addition, high concentration (more than or equal to $10_{20}/cm_3$) impurities are implanted in the lower electrode 11 of the capacitor 10. This prevents a depletion layer from extending on the lower electrode 11 side and becoming highly resistive to slow down charging and discharging operation of the electric charges while the capacitor 10 operates.

As the foregoing, the DRAM according to the present invention has the capacitor arrangement comprising the first capacitor portion formed along the surface of the insulation layer on the substrate and the second capacitor portion formed extending vertically and upwardly from the outermost peripheral portion of the first region, so that capacitance of the capacitor can be increased and ensured even though the plane area of the capacitor is reduced. Furthermore, with the bit line disposed below the main part of the electrode layer of the capacitor, the adjacent capacitors can be isolated without considering the bit line contact portion, making the isolation region smaller and allowing the plane area of the capacitor to be increased. In addition, since the semiconductor memory device according to the present invention has the capacitor formed by patterning the lower electrode layer formed on the stepped portion comprising the contact hole and the capacitor insulating layer, the adjacent capacitors can be easily isolated from each other and the lower electrode of the capacitor can be integrally formed, so that it is possible to improve reliability of the insulation layer of the capacitor formed thereon.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor memory device having first and second stacked capacitors which are formed on first and second capacitor forming regions, respectively, separated from each other on a main surface of a semiconductor substrate, comprising the steps of:

forming a first insulation layer having an opening reaching the main surface of said semiconductor substrate, forming a first conductive layer on a surface of said first insulation layer and inside said opening, forming a second insulation layer on a surface of said first conductive layer, patterning said second insulation layer to form a capacitor isolating layer having vertical sidewall surfaces on a region interposed between said first and second capacitor forming regions, forming a second conductive layer on the surface of said first conductive layer and the upper and side surfaces of said capacitor isolating layer, removing a portion of said second conductive layer positioned on the upper surface of said capacitor isolating layer, removing said capacitor isolating layer and then a portion of said first conductive layer just under said capacitor isolating layer, forming a dielectric layer on a surface of said second conductive layer, and forming a third conductive layer on a surface of said dielectric layer.

* * * * *

UNITED STATES PATENT AND TRADEMARK OFFICE
CERTIFICATE OF CORRECTION

PATENT NO. : 5,798,289
DATED : August 25, 1998
INVENTOR(S) : Natsuo AJIKA et al

It is certified that error appears in the above-indentified patent and that said Letters Patent is hereby corrected as shown below: On the title page, and column 1, line 9, in the Related U.S. Application Data, please replace "6,434,439" with --5,434,439--

Signed and Sealed this

Nineteenth Day of January, 1999

Attest:

Attesting Officer

*Acting Commissioner of Patents and Trademarks*